United States Patent
Meiser et al.

(10) Patent No.: US 9,070,741 B2
(45) Date of Patent: Jun. 30, 2015

(54) METHOD OF MANUFACTURING A SEMICONDUCTOR DEVICE AND A SEMICONDUCTOR WORKPIECE

(71) Applicant: Infineon Technologies Austria AG, Villach (AT)

(72) Inventors: Andreas Meiser, Sauerlach (DE); Markus Zundel, Egmating (DE); Martin Poelzl, Ossiach (AT); Paul Ganitzer, Villach (AT); Georg Ehrentraut, Villach (AT)

(73) Assignee: Infineon Technologies Austria AG, Villach (AT)

( * ) Notice: Subject to any disclaimer, the term of this patent is extended or adjusted under 35 U.S.C. 154(b) by 112 days.

(21) Appl. No.: 13/716,967

(22) Filed: Dec. 17, 2012

(65) Prior Publication Data

US 2014/0167209 A1    Jun. 19, 2014

(51) Int. Cl.
*H01L 21/78* (2006.01)
*H01L 21/762* (2006.01)
*H01L 21/822* (2006.01)
*H01L 29/78* (2006.01)

(52) U.S. Cl.
CPC ......... *H01L 21/76224* (2013.01); *H01L 21/822* (2013.01); *H01L 29/78* (2013.01)

(58) Field of Classification Search
CPC .............................. H01L 21/78; H01L 21/822
USPC .................................................. 438/462, 464
See application file for complete search history.

(56) References Cited

U.S. PATENT DOCUMENTS

| 8,168,474 | B1 * | 5/2012 | Adkisson et al. | 438/113 |
|---|---|---|---|---|
| 8,268,677 | B1 * | 9/2012 | Pagaila | 438/127 |
| 8,298,917 | B2 * | 10/2012 | Andry et al. | 438/462 |
| 8,350,379 | B2 * | 1/2013 | Low et al. | 257/698 |
| 8,735,287 | B2 * | 5/2014 | Haba et al. | 438/667 |
| 8,810,011 | B2 * | 8/2014 | Pagaila | 257/660 |
| 2006/0003552 | A1 * | 1/2006 | Okada | 438/462 |
| 2007/0087532 | A1 * | 4/2007 | Bauer et al. | 438/460 |
| 2008/0318396 | A1 * | 12/2008 | Shin et al. | 438/462 |
| 2009/0197394 | A1 | 8/2009 | Parekh | |
| 2009/0261388 | A1 * | 10/2009 | Hendricks et al. | 257/288 |
| 2010/0227454 | A1 * | 9/2010 | Dohmae | 438/464 |
| 2010/0261335 | A1 | 10/2010 | Andry et al. | |
| 2012/0289023 | A1 | 11/2012 | Ahrens et al. | |

(Continued)

OTHER PUBLICATIONS

Peter Nelle, et al. "Semiconductor Device Including a Stress Relief Layer and Method of Manufacturing." U.S. Appl. No. 13/571,462, filed Aug. 10, 2012.

*Primary Examiner* — George Fourson, III
(74) *Attorney, Agent, or Firm* — Murphy, Bilak & Homiller, PLLC

(57) ABSTRACT

A semiconductor device is manufactured in a semiconductor substrate comprising a first main surface, the semiconductor substrate including chip areas. The method of manufacturing the semiconductor substrate comprises forming components of the semiconductor device in the first main surface in the chip areas, removing substrate material from a second main surface of the semiconductor substrate, the second main surface being opposite to the first main surface, forming a separation trench into a first main surface of the semiconductor substrate, the separation trench being disposed between adjacent chip areas. The method further comprises forming at least one sacrificial material in the separation trench, and removing the at least one sacrificial material from the trench.

24 Claims, 32 Drawing Sheets

(56) References Cited

U.S. PATENT DOCUMENTS

2013/0084659 A1* 4/2013 Martens et al. ............... 438/14
2013/0256843 A1* 10/2013 Chen et al. .................... 257/622
2014/0159196 A1* 6/2014 Mackh et al. ................. 257/531

* cited by examiner

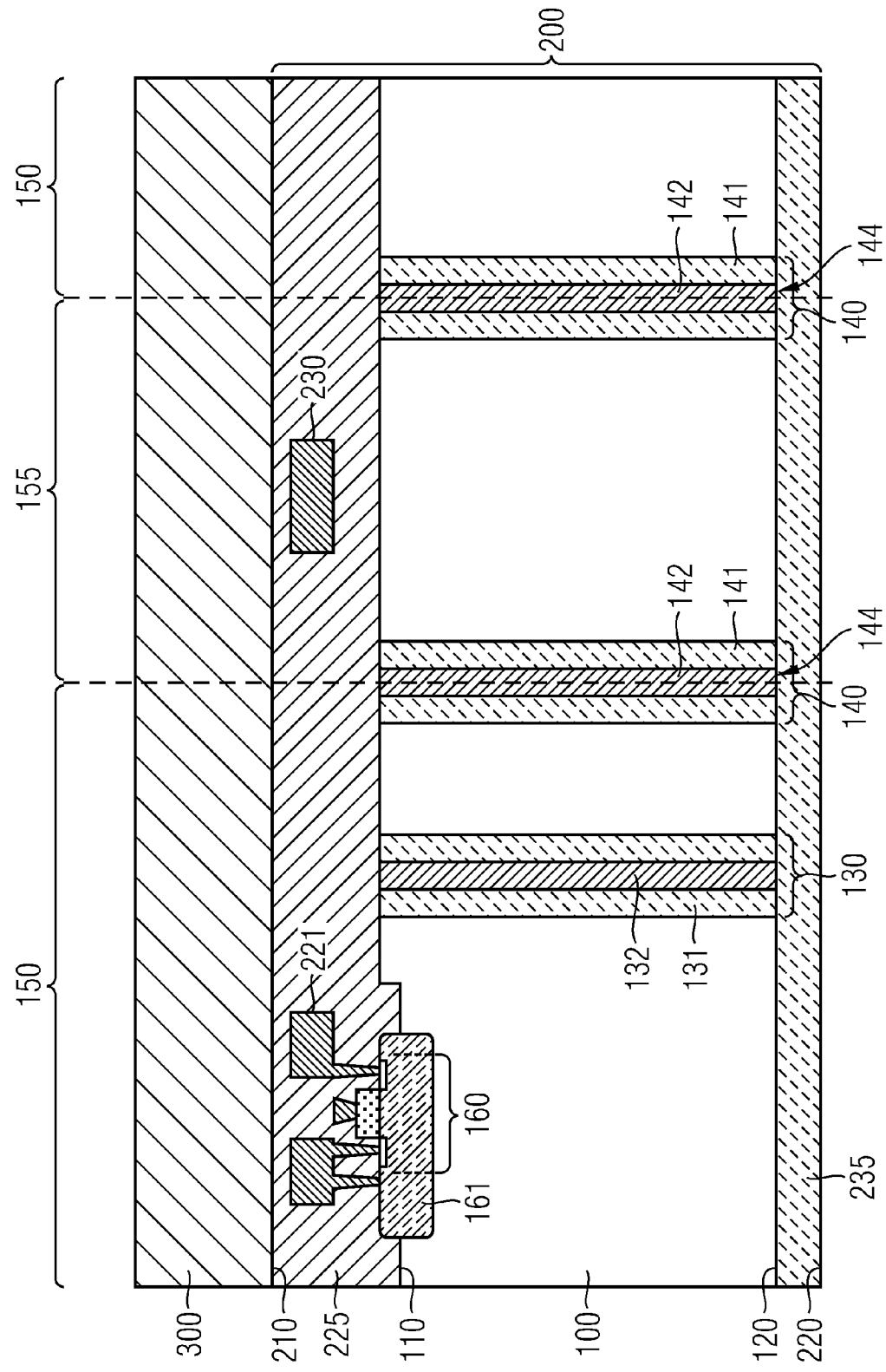

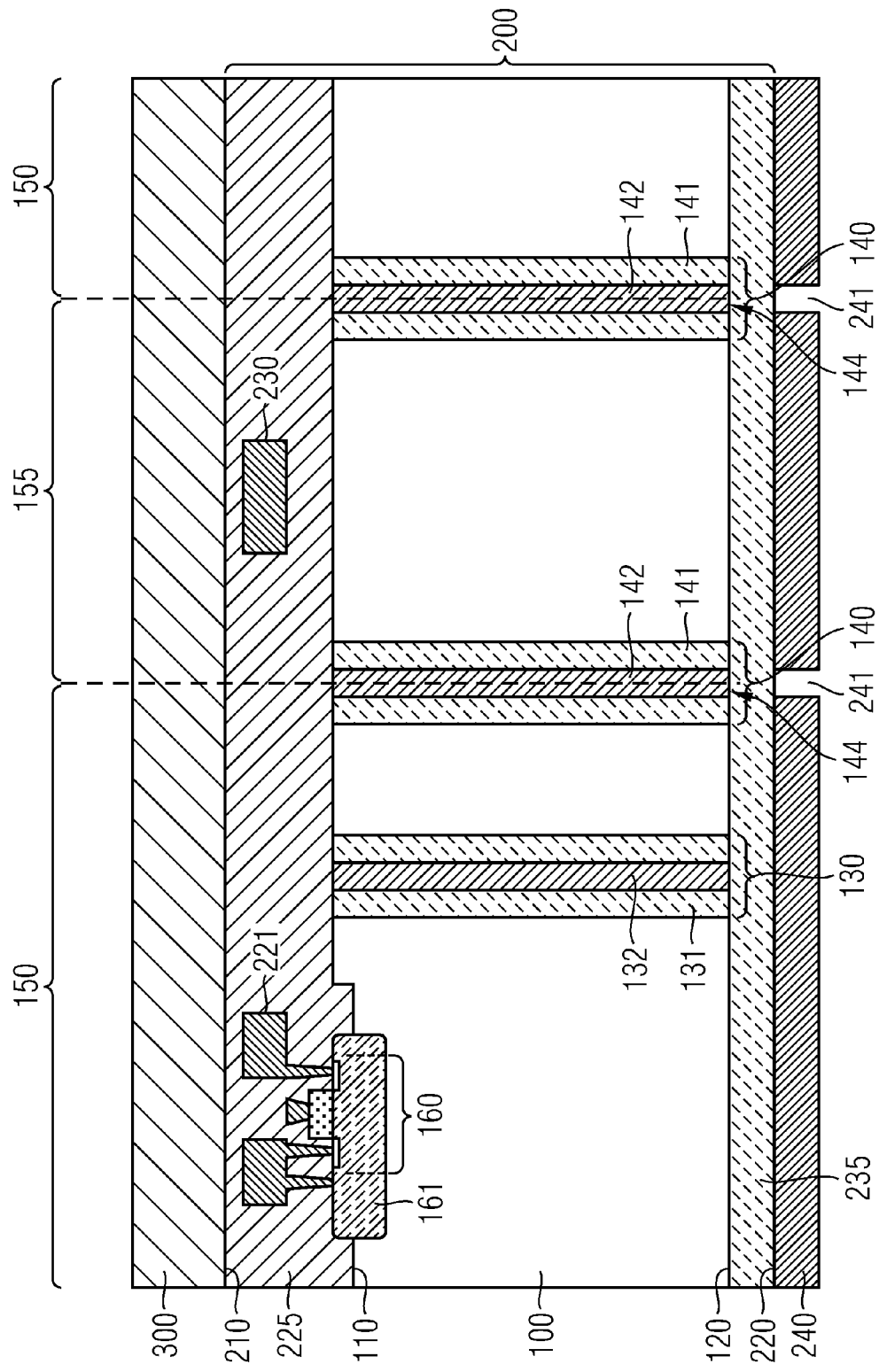

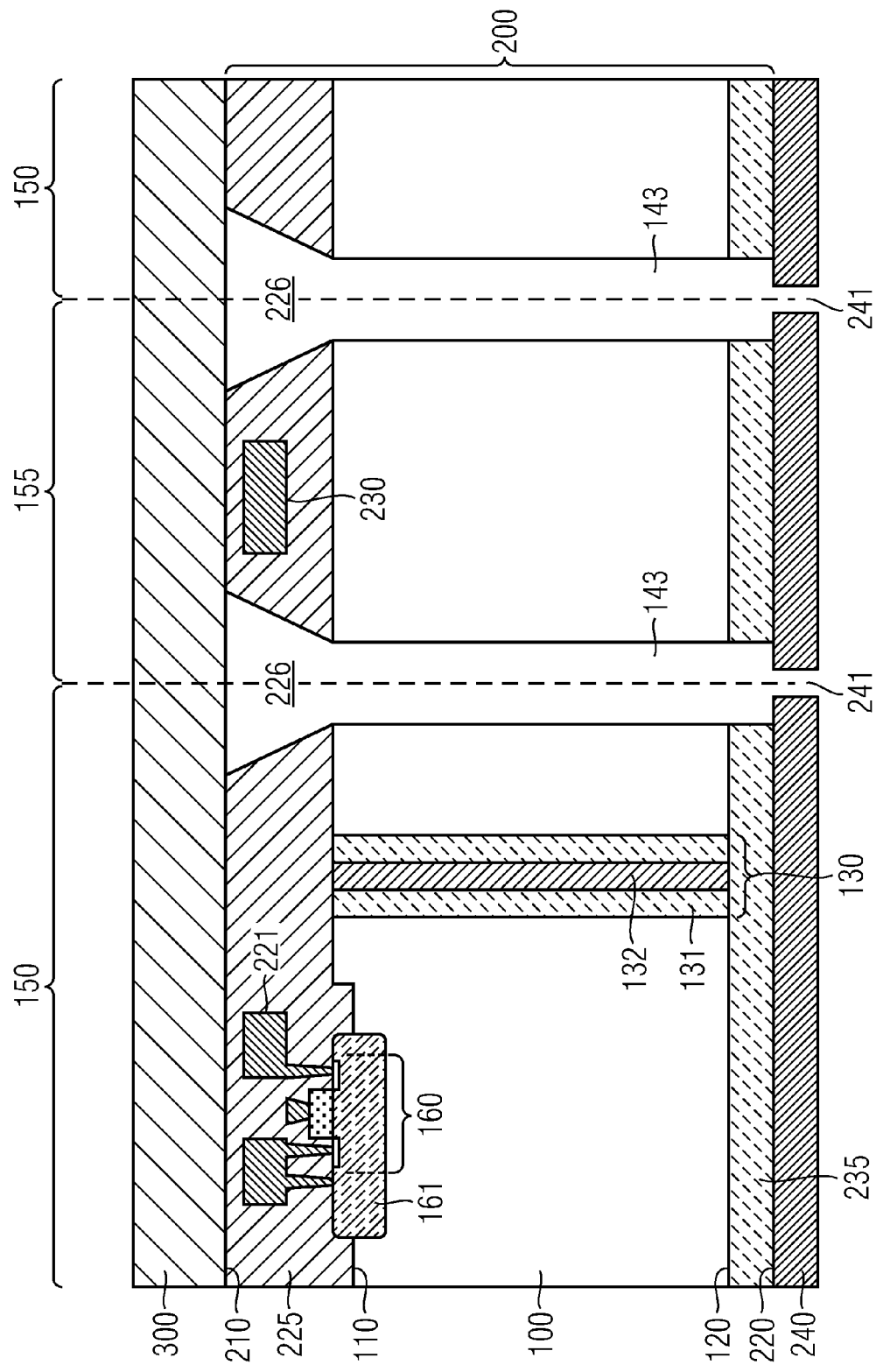

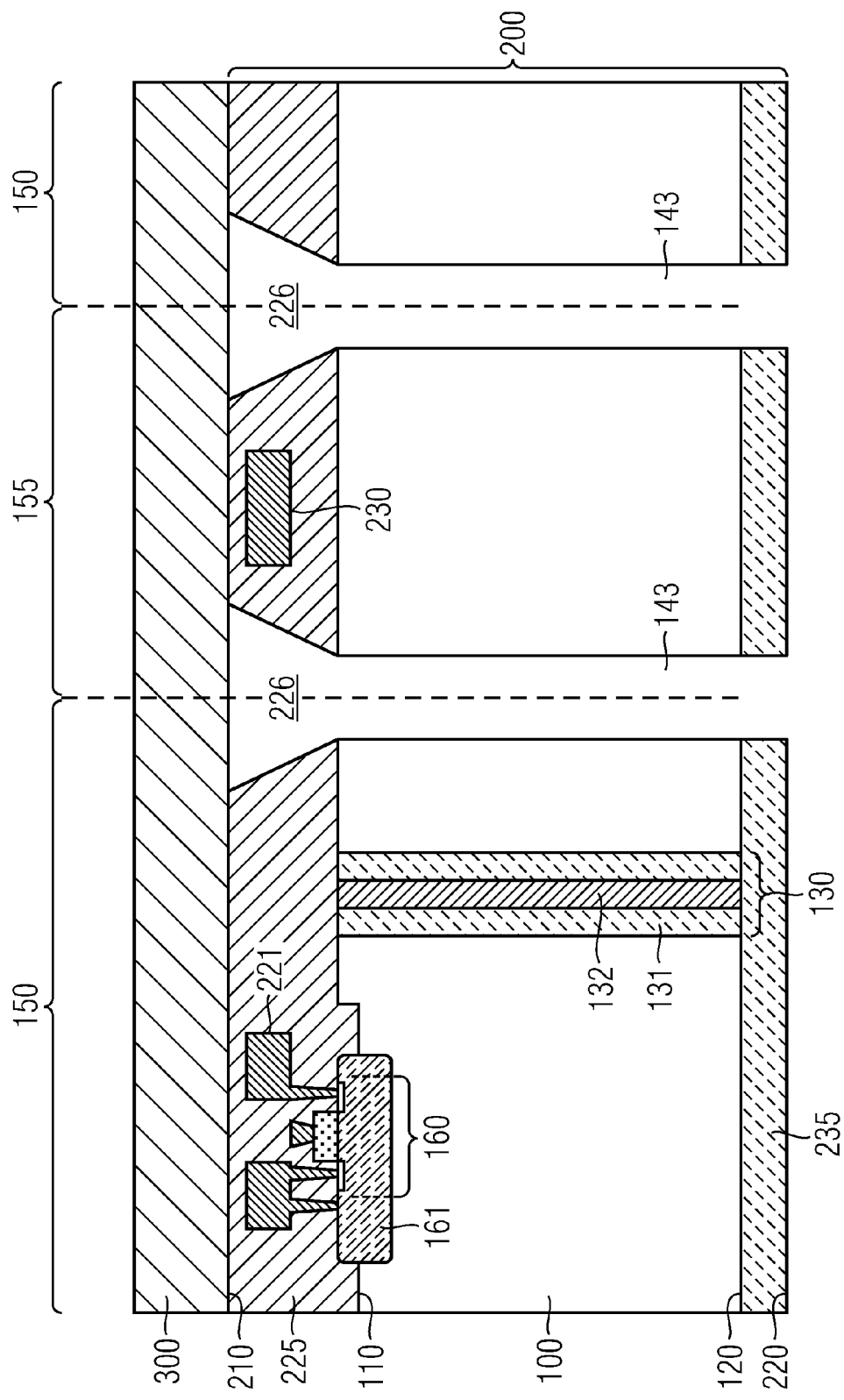

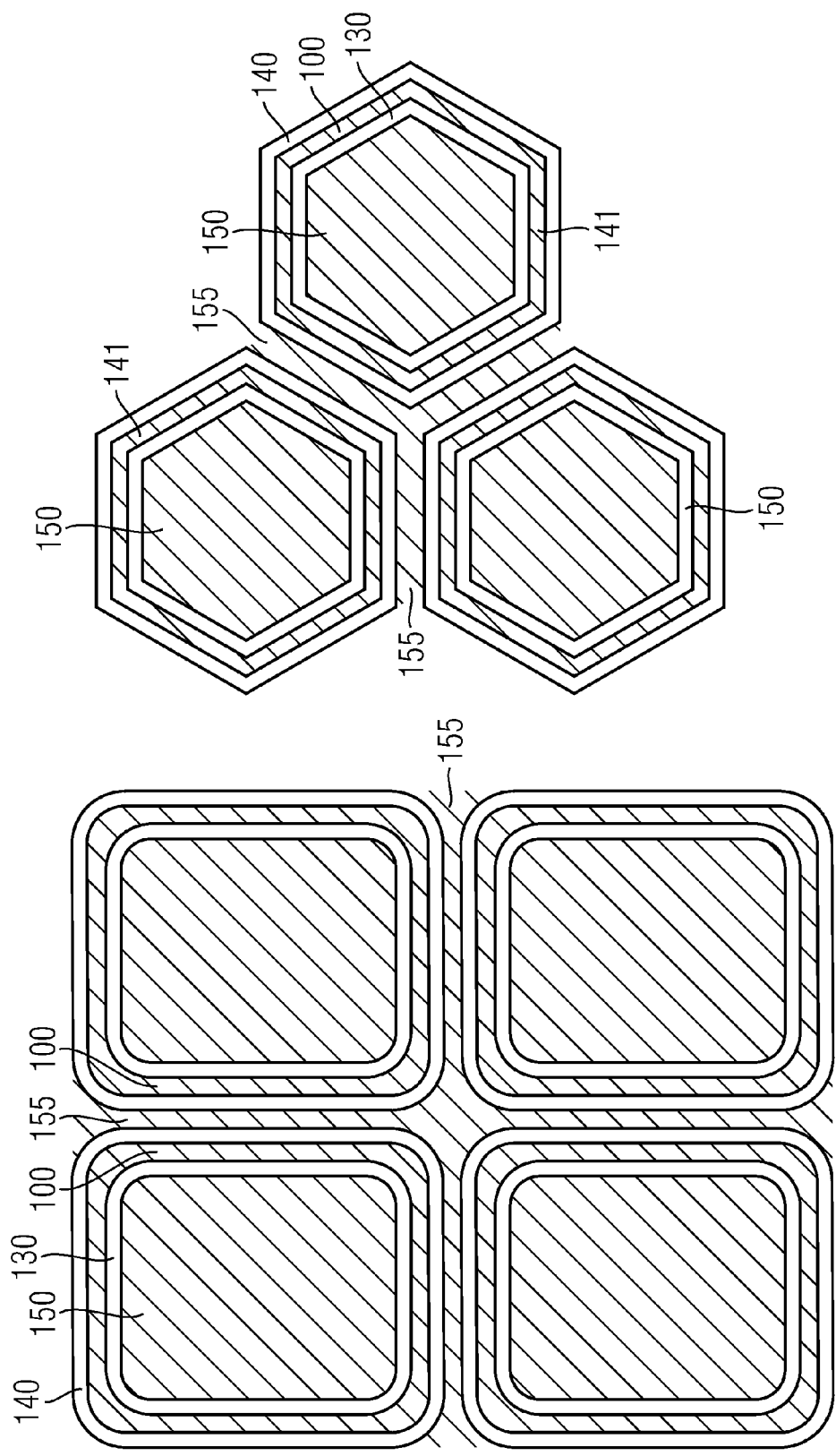

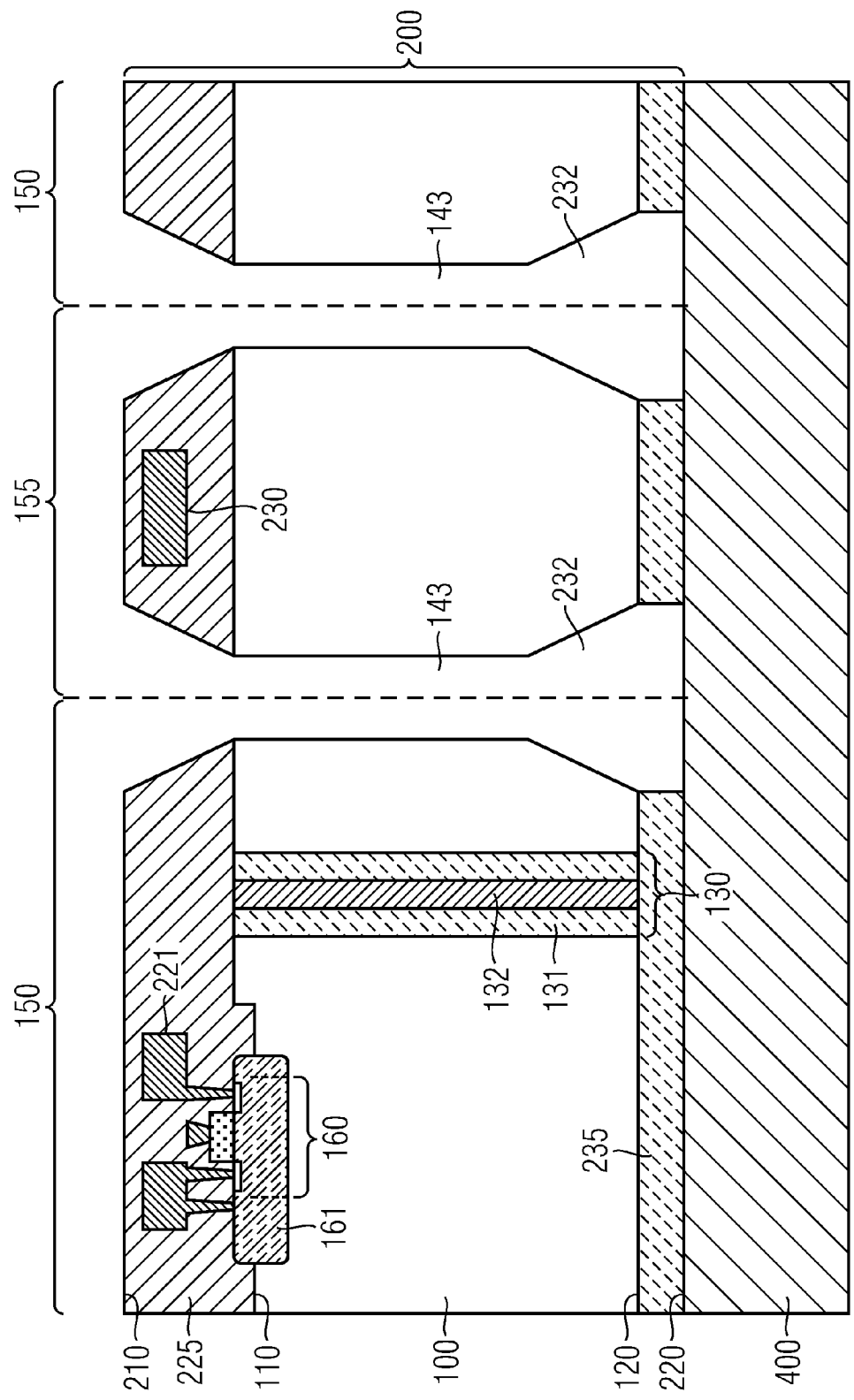

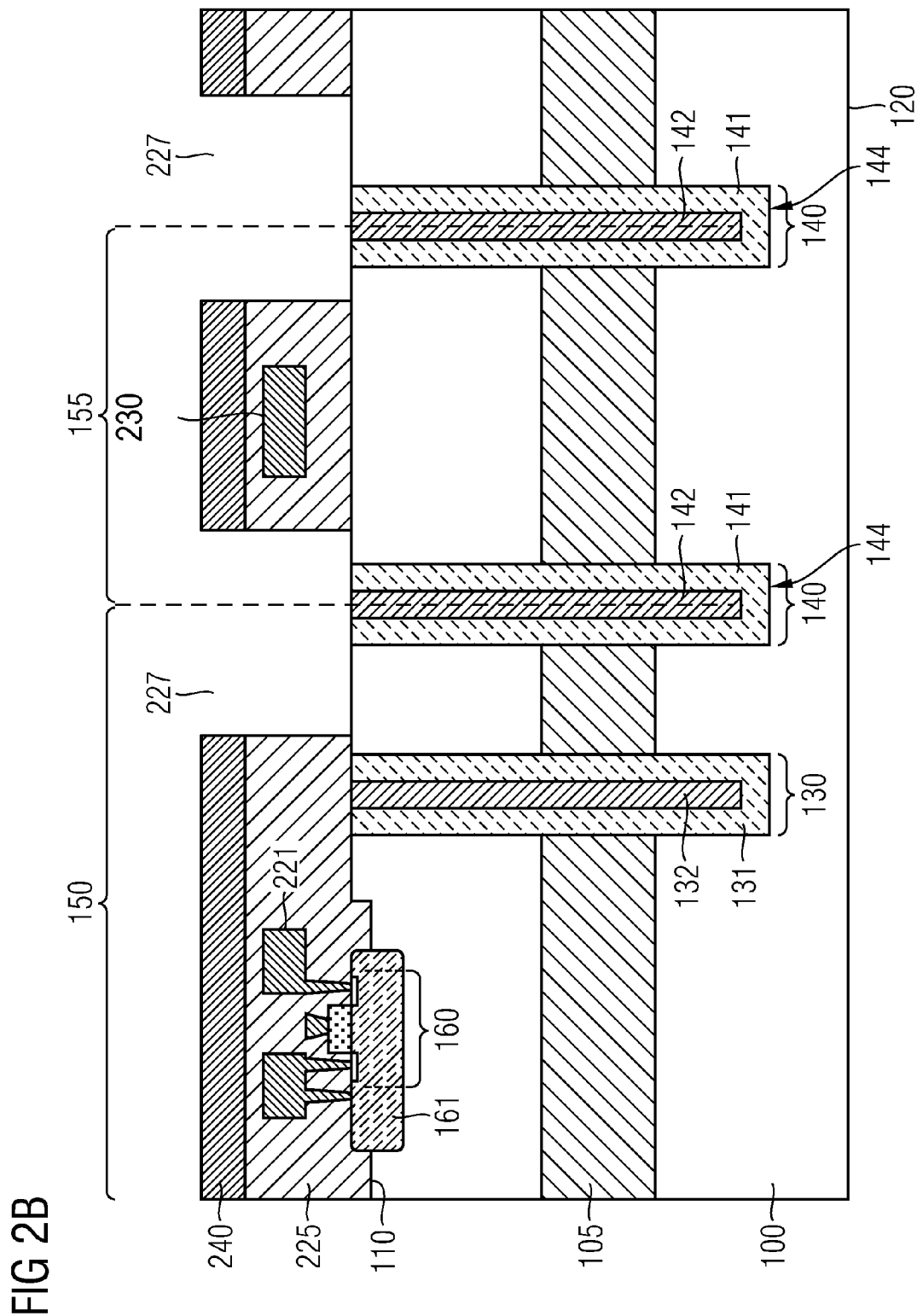

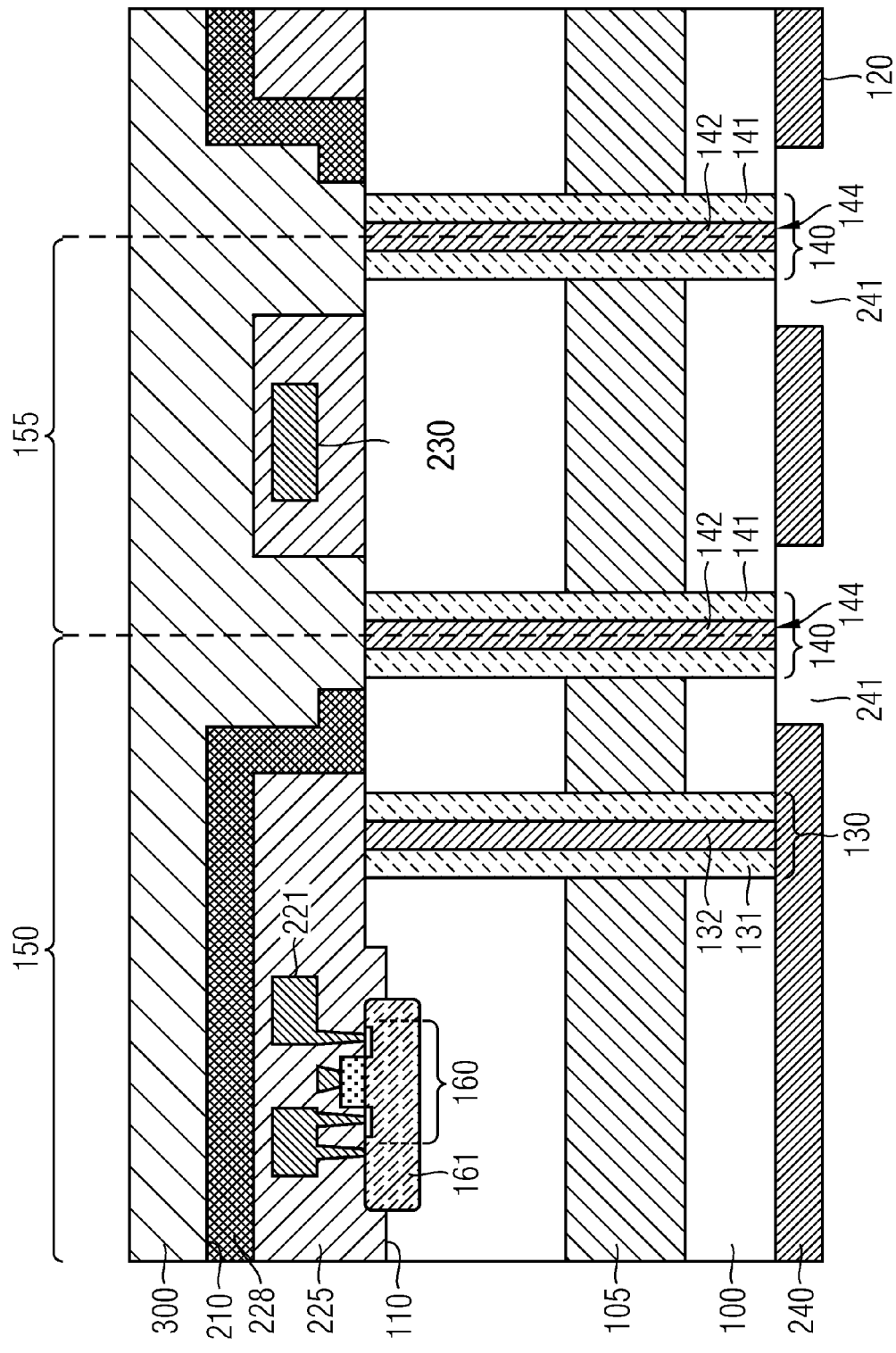

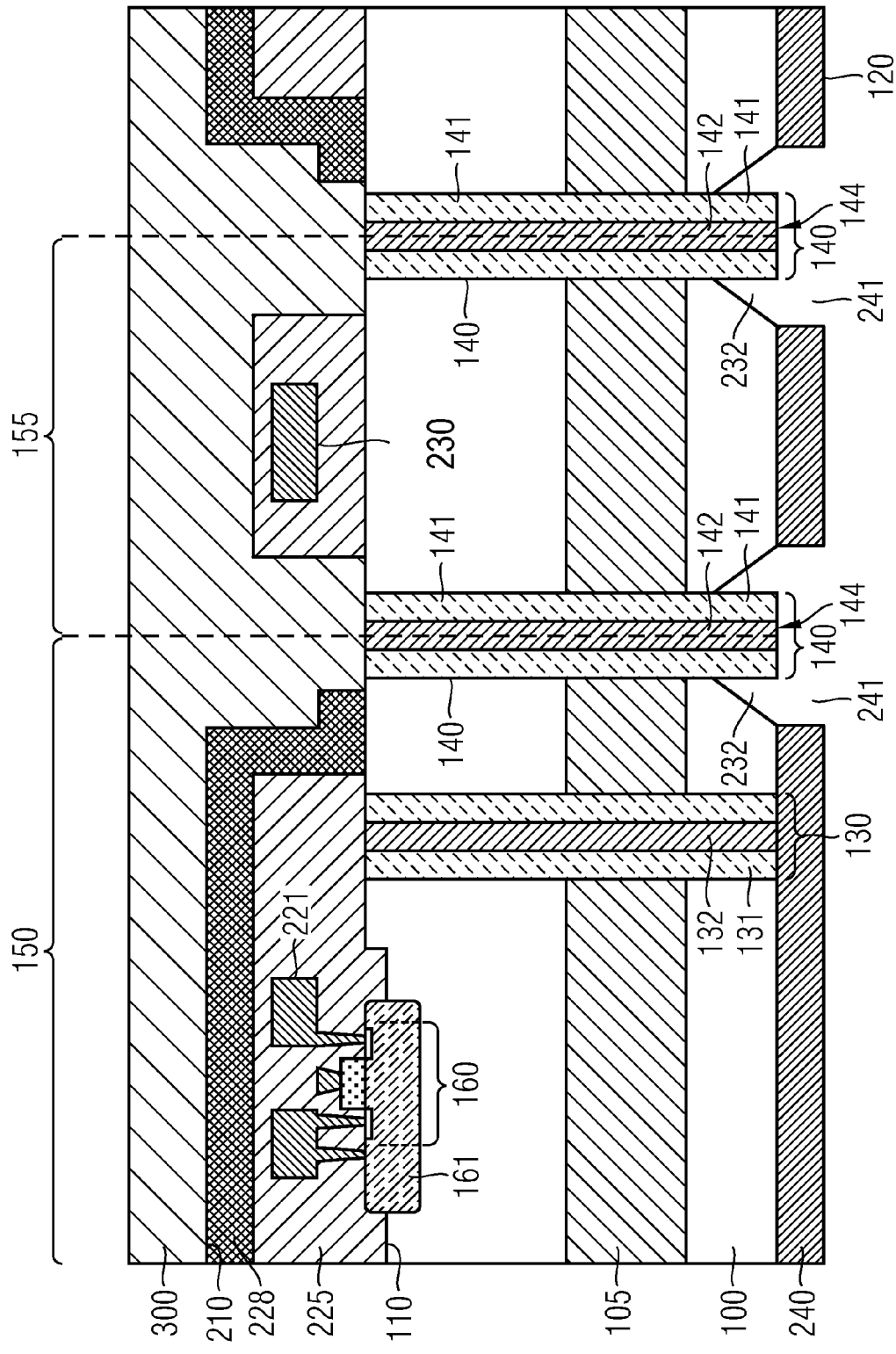

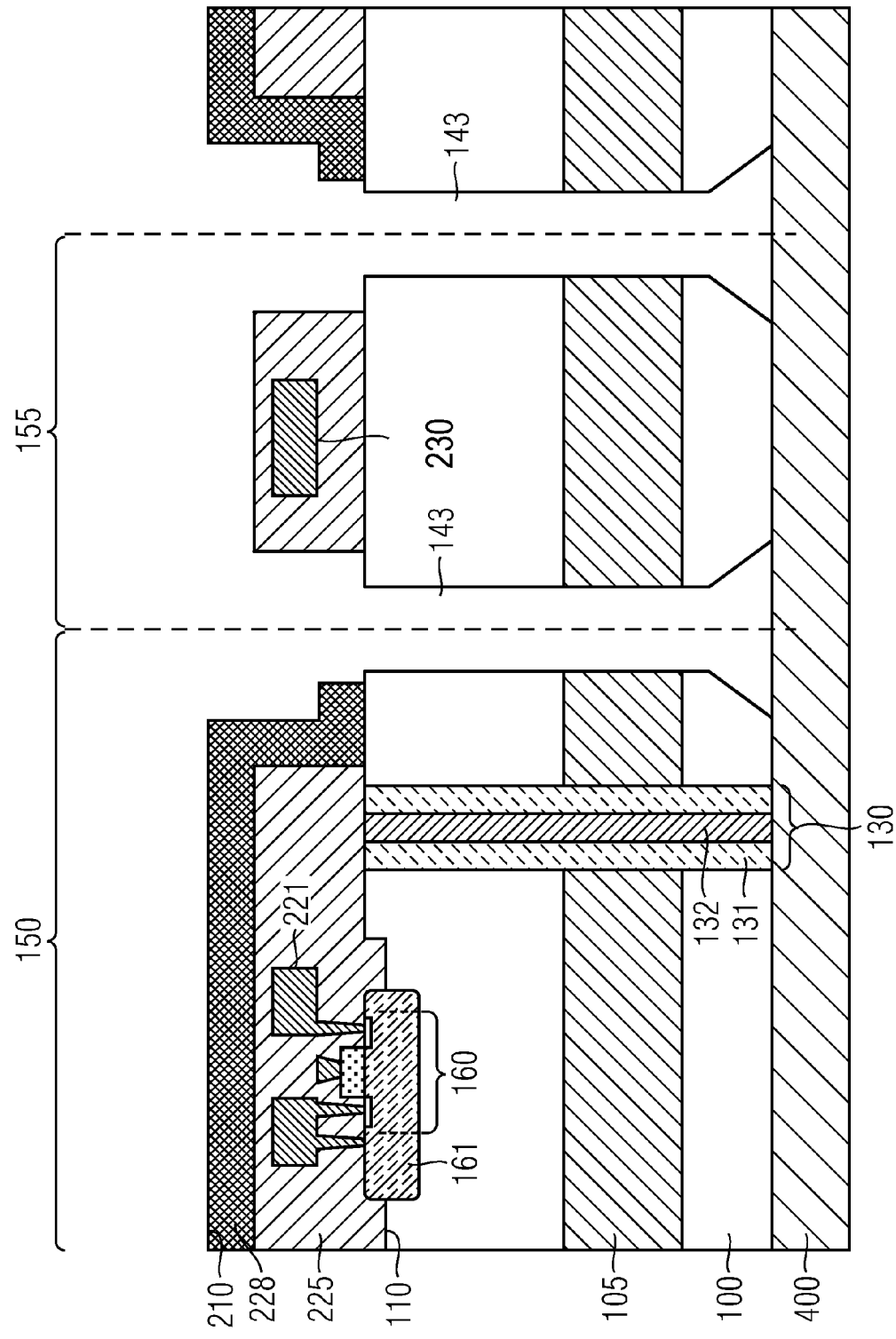

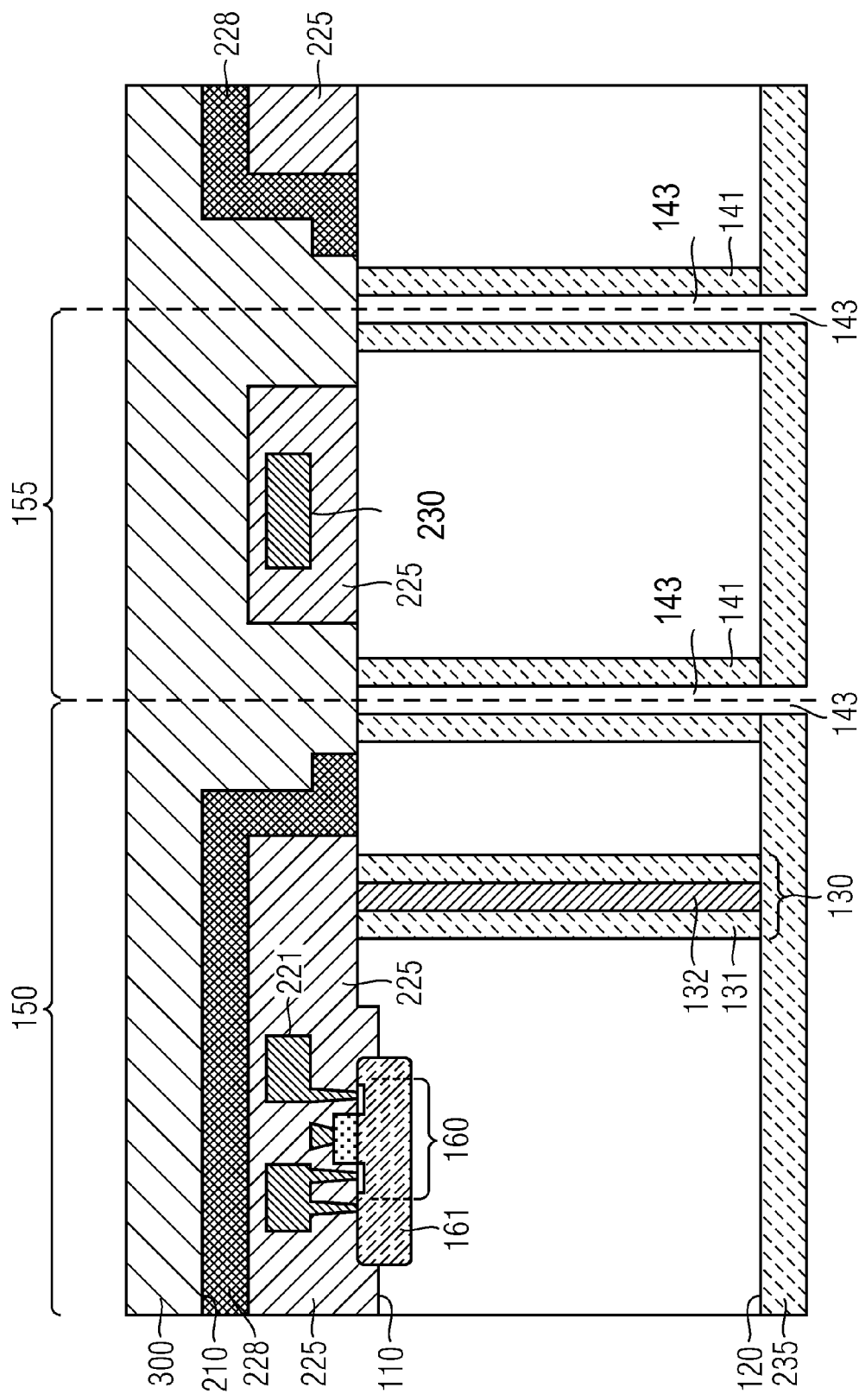

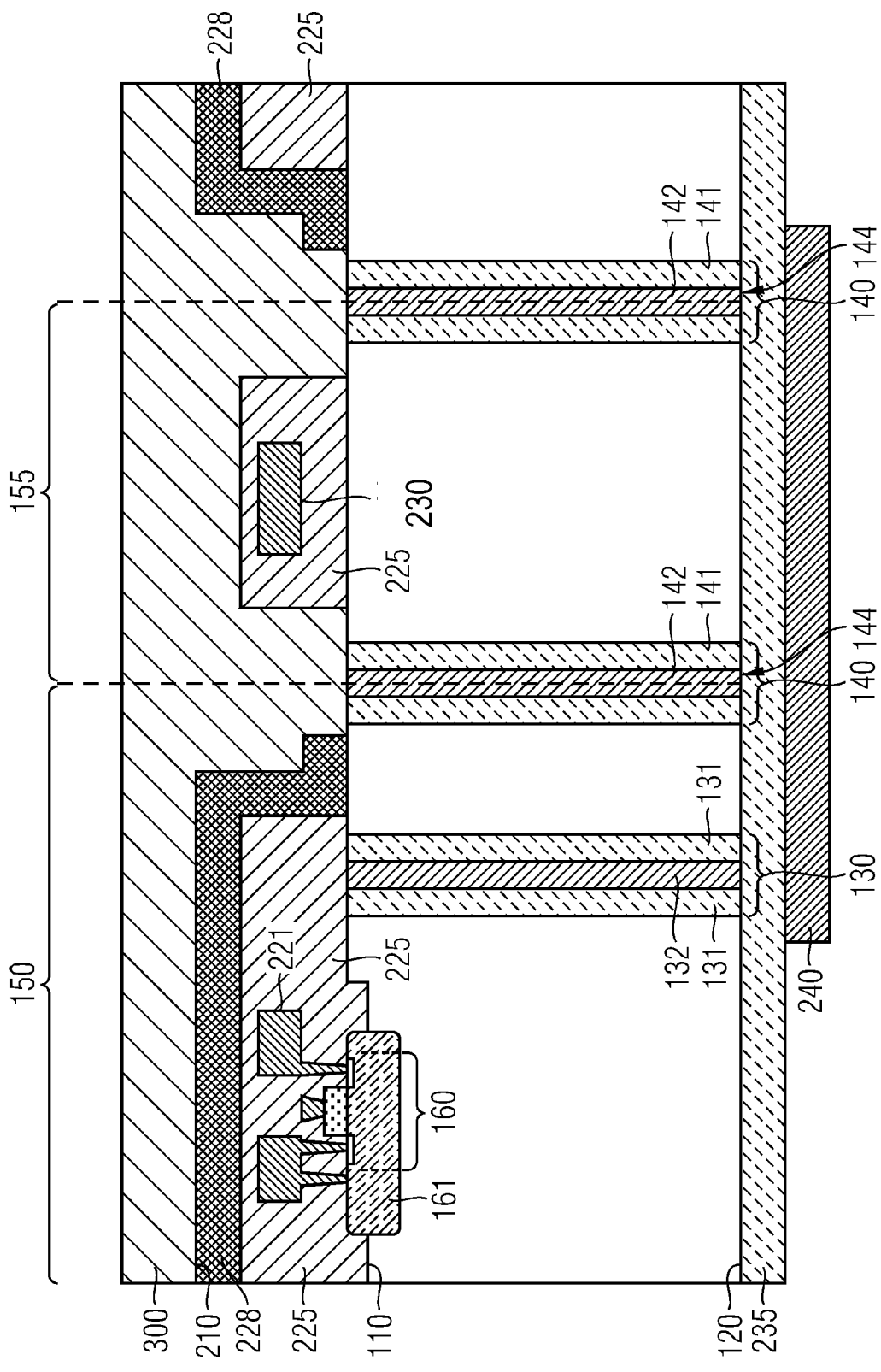

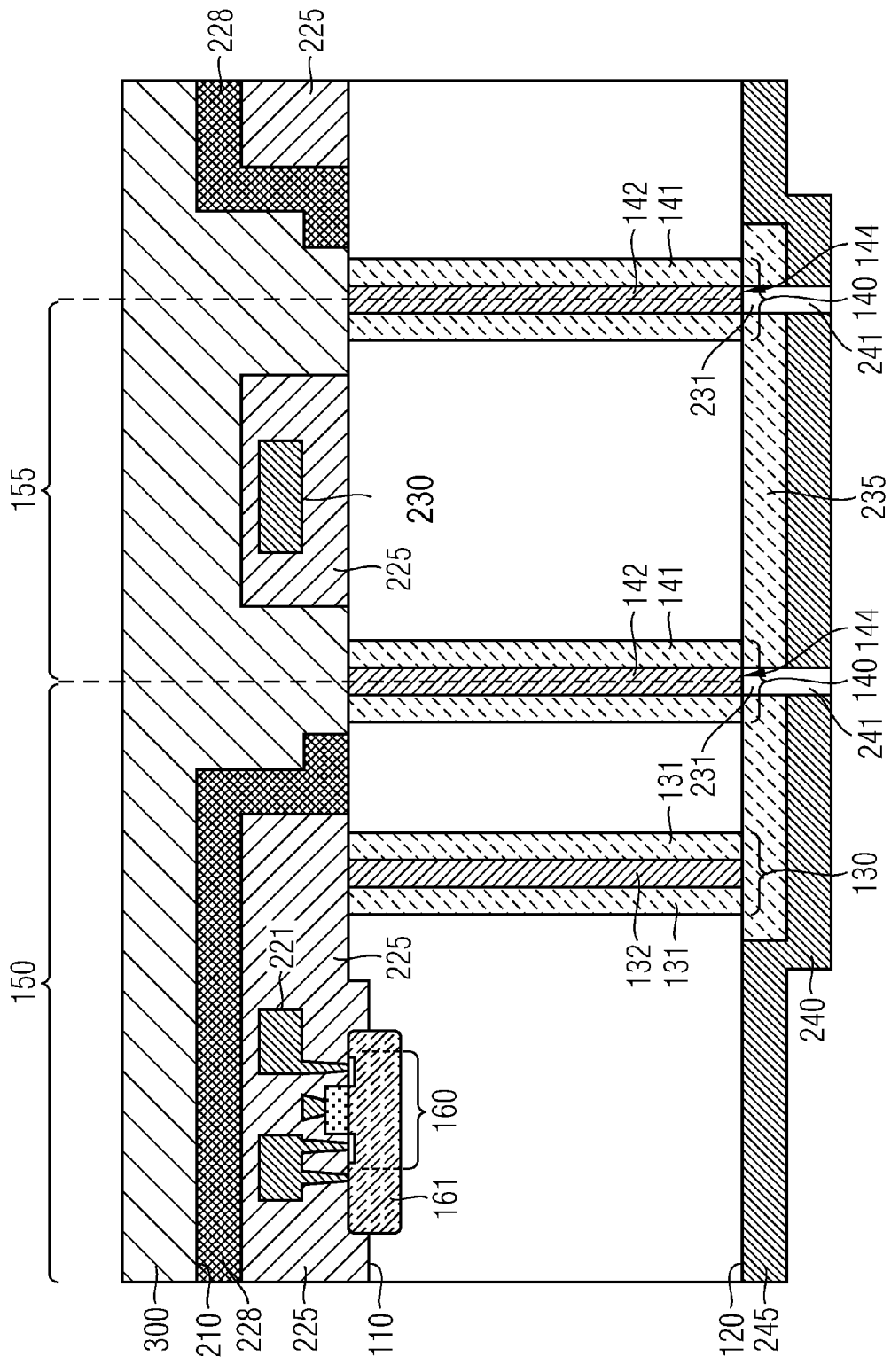

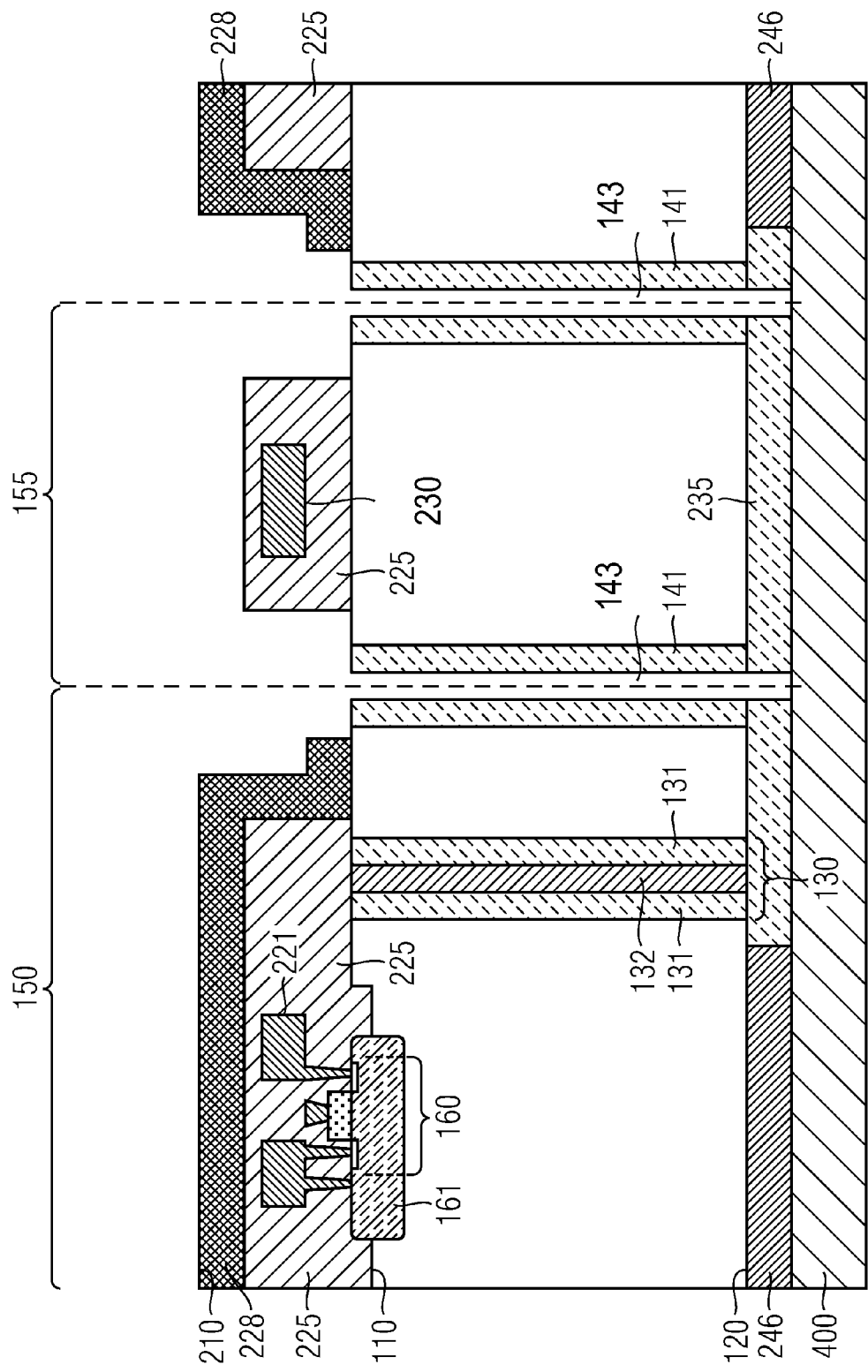

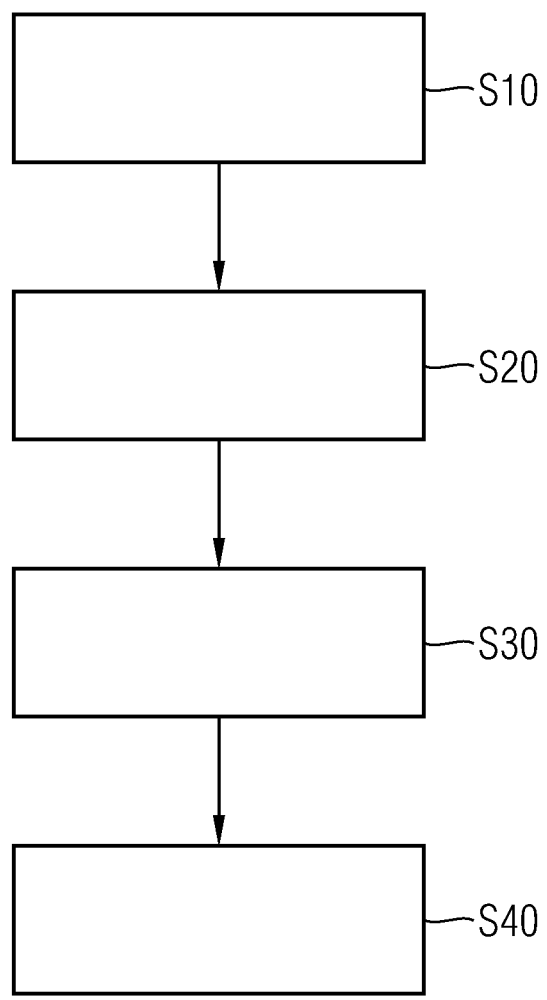

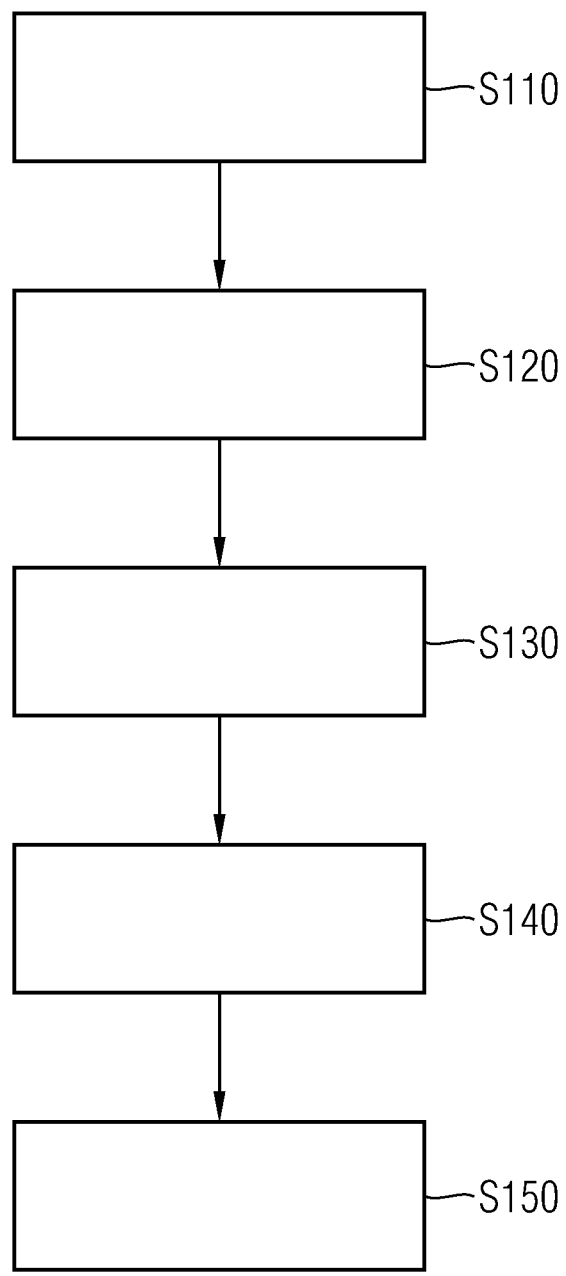

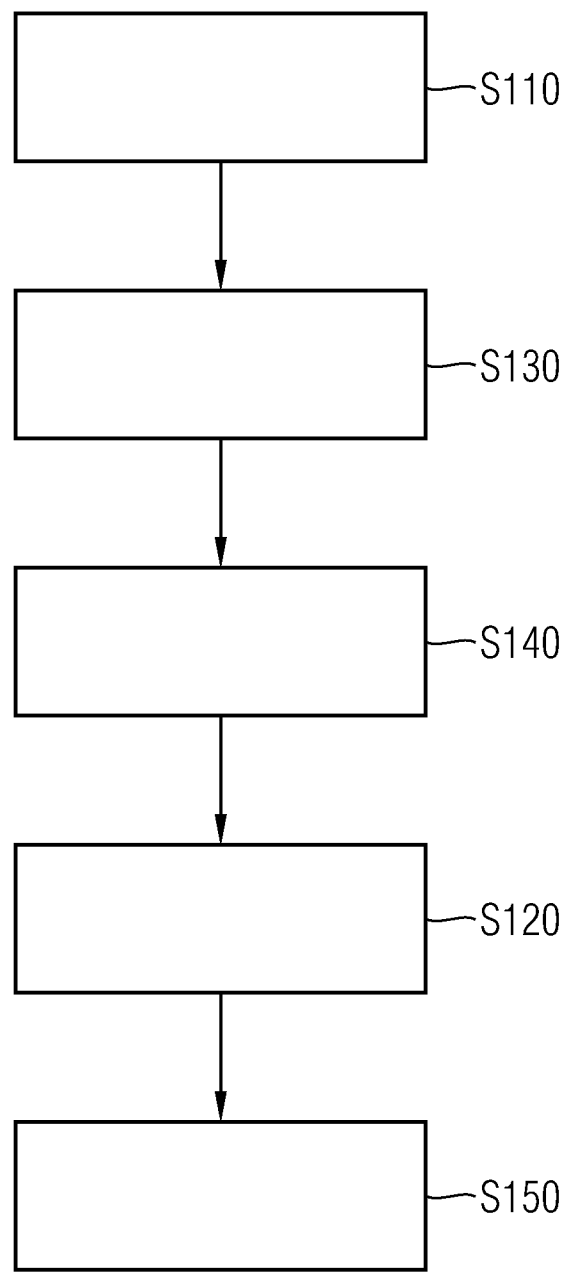

METHOD OF MANUFACTURING A SEMICONDUCTOR DEVICE AND A SEMICONDUCTOR WORKPIECE

TECHNICAL FIELD

The present disclosure relates to a method of manufacturing a semiconductor device and to a semiconductor workpiece.

RELATED BACKGROUND

Power devices, for example, MOS power transistors attempt to achieve a small on-resistance which is defined by $R_{on}$·area, while at the same time achieving a high breakdown voltage Vds when being in an off state. Approaches have been made to manufacture these power transistors on thin to ultra-thin substrates having a thickness of less than 100 µm, for example 70 µm or less and having even a thickness of 10 to 20 µm, depending on the voltage class in which the device is being employed.

According to generally employed semiconductor manufacturing processes, components of semiconductor devices are processed by processing semiconductor wafers. After manufacturing the single devices, the wafer is isolated into single chips. When semiconductor devices are manufactured on thin substrates, problems may arise when isolating the single chips by conventional isolation or dicing processes.

SUMMARY

According to an embodiment, a method of manufacturing a semiconductor device comprises forming a separation trench into a first main surface of a semiconductor substrate, forming at least one sacrificial material in the separation trench. The method further includes removing substrate material from a second main surface of the semiconductor substrate, the second main surface being opposite to the first main surface, so as to uncover a bottom side of the trench. The method further includes removing the at least one sacrificial material from the bottom side of the trench, after the substrate material has been removed from the second main surface.

According to an embodiment, a semiconductor workpiece comprises a semiconductor substrate, at least two chip areas, components of semiconductor devices being formed in the semiconductor substrate in the chip areas, and a separation trench being disposed between adjacent chip areas. The separation trench is formed in a first main surface of the semiconductor substrate and extends from the first main surface to a second main surface of the semiconductor substrate, the second main surface being disposed opposite to the first main surface. The separation trench is filled with at least one sacrificial material.

According to an embodiment, a method of manufacturing a semiconductor device in a semiconductor substrate comprising a first main surface, the semiconductor substrate including chip areas, includes forming components of the semiconductor device in the first main surface in the chip areas, removing substrate material from a second main surface of the semiconductor substrate, the second main surface being opposite to the first main surface, forming a separation trench into a first main surface of a semiconductor substrate, the separation trench being disposed between adjacent chip areas, forming at least one sacrificial material in the separation trench, and removing the at least one sacrificial material from the trench.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIGS. 1A to 1J illustrate a method of manufacturing a semiconductor device according to an embodiment;

FIGS. 2A to 2H illustrate a method of manufacturing a semiconductor device according to a further embodiment;

FIGS. 3A to 3E illustrate a method of manufacturing a semiconductor device according to an embodiment;

FIGS. 4A to 4F illustrate a method of manufacturing a semiconductor device according to a further embodiment;

FIG. 5 schematically illustrates a method of manufacturing a semiconductor device according to an embodiment; and FIGS. 6A and 6B schematically illustrate a method of manufacturing a semiconductor device according to further embodiments.

DETAILED DESCRIPTION

Figure 1C:
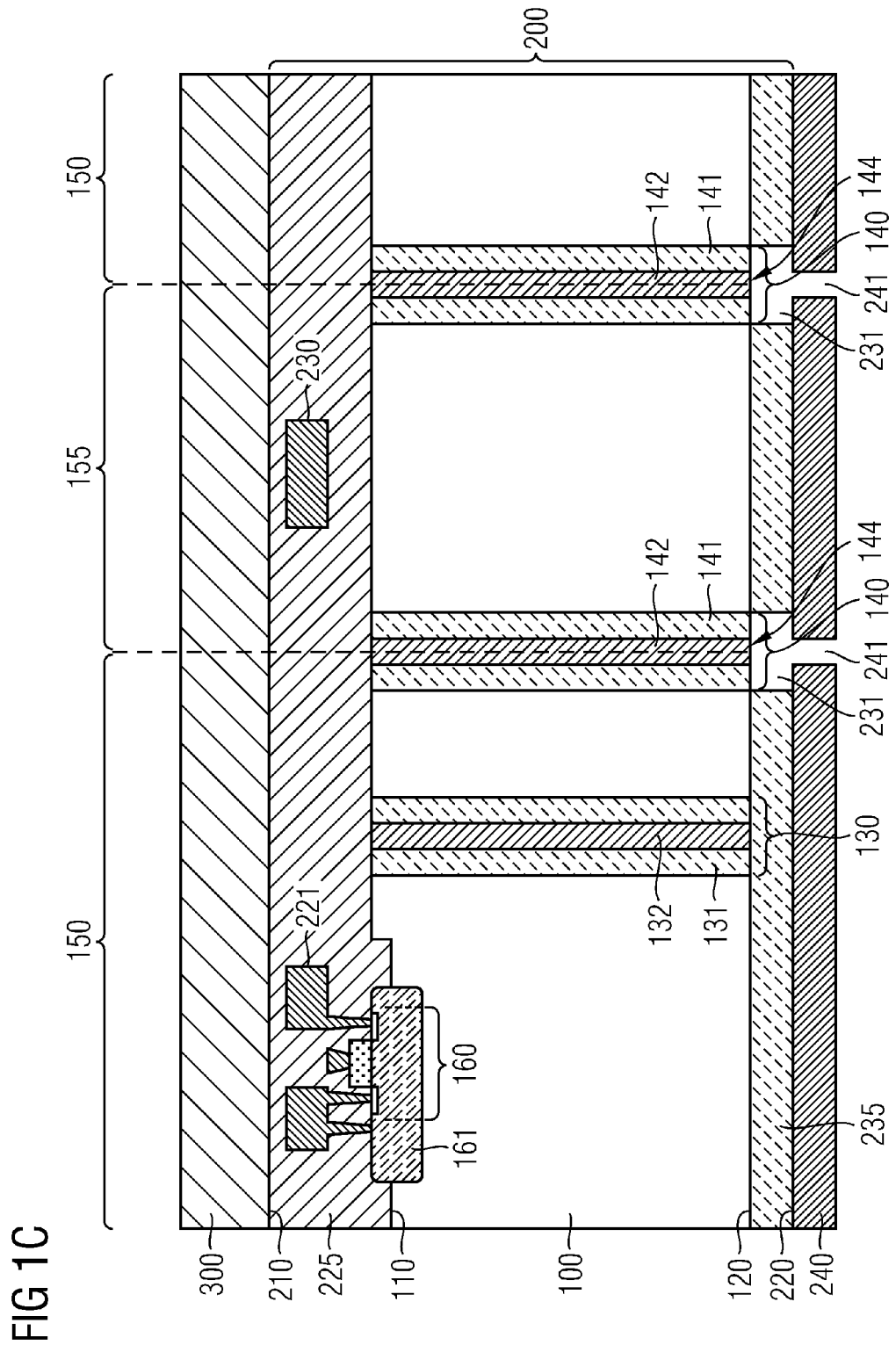

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The term "vertical" as used in this specification intends to describe an orientation which is arranged perpendicular to the first surface of the semiconductor substrate or semiconductor body.

The terms "lateral" and "horizontal" as used in this specification intends to describe an orientation parallel to a first surface of a semiconductor substrate or semiconductor body. This can be for instance the surface of a wafer or a die.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

FIG. 1A shows a cross-sectional view of a semiconductor workpiece according to an embodiment, which may form a starting point for implementing a method according to an embodiment. Alternatively, the workpiece may be obtained when performing the method according to an embodiment.

The workpiece may comprise a semiconductor substrate 100 having a first main surface 110 and a second main surface 120. The workpiece comprises a chip area 150 and a kerf area 155. Generally, in a semiconductor substrate such as a semiconductor wafer, a plurality of chip areas 150 are defined, adjacent chip areas 150 being separated from each other by a kerf area 155. Components of semiconductor devices are formed in each of the chip areas 150. For example, transistors 160 and other semiconductor devices may be formed in each of the chip areas 150. The semiconductor devices may comprise doped regions 161, conductive lines 221 or pads, and insulating material. For example, components of the semiconductor devices may be formed in the semiconductor substrate 100 or in a region adjacent to a first main surface 110 of the semiconductor substrate 100. Further components of the semiconductor devices may be disposed outside the semiconductor substrate 100. For example, conductive lines 221, contact pads and other components may be formed over the semiconductor substrate 100 and may, for example, be disposed within an insulating layer 225. The chip area 150 may further comprise isolation trenches 130 being filled with at least one insulating material 131 such as silicon oxide. A further insulating or conductive material 132 may be disposed in the isolation trenches 130, the further insulating or conductive material 132 being insulated from the substrate material 100 by the insulating layer 131. For example, these isolation trenches 130 may insulate adjacent portions of the chip area 150.

According to further embodiments, contact trenches having a similar construction as the isolation trenches 130 may be disposed within the semiconductor substrate 100. For example, the further insulating or conductive material 132 may be conductive, so that an electrical contact from the first main surface 110 to the second main surface 120 may be accomplished by the further insulating or conductive material 132. For example, a distance between the first main surface 110 and the second main surface 120 may be less than 100 μm, for example, less than 60 μm, for example 40 μm.

In the embodiment shown in FIG. 1A, an insulating layer 225 is disposed over the first main surface 110 of the semiconductor substrate 100. A surface of the insulating layer 225 defines a surface 210 of the workpiece 200.

Further, on a back side of the semiconductor substrate 100, a further insulating layer 235 may be disposed so as to define a workpiece back side 220. Within the kerf area 155, for example, test structures, pads, contact pads 230 may be disposed so as to fulfil several functions according to specific needs. For example, test structures or patterns for monitoring a wafer processing method may be arranged in the kerf area 155.

In the embodiment illustrated in FIG. 1A, a separation trench 140 is disposed between the kerf area 155 and an adjacent chip area 150. The separation trench 140 is formed in the first main surface 110 of the semiconductor substrate 100. The separation trench 140 extends in a direction intersecting the illustrated plane of the drawing. For example, the separation trench 140 may extend perpendicularly with respect to the plane of the drawing. According to a further embodiment, depending on the desired shape of the resulting chips, the separation trench 140 may extend in an arbitrary direction intersecting the plane of the drawing. The separation trench 140 is filled with at least one sacrificial material. For example, the sacrificial material may comprise a first sacrificial layer 141 which may be insulating. The first sacrificial layer 141 is disposed adjacent to a sidewall of the separation trench 140. The first sacrificial layer 141 extends along the sidewall of the separation trench 140 to a bottom side 144 thereof. Moreover, the interior of the separation trench 140 may be filled with a second sacrificial layer 142 which is different from the first material. For example, the first layer 141 may be insulating and the second sacrificial layer 142 may be conductive. In the embodiment illustrated in FIG. 1A, the separation trench 140 extends from the first main surface 110 of the semiconductor substrate 100 to the second main surface 120 of the semiconductor substrate 100. The separation trench 140 may be completely filled with the sacrificial material so that the sacrificial filling is flush with the first main surface 110. The sacrificial material may comprise silicon oxide, for example, thermally grown silicon oxide, silicon nitride or polysilicon and any combination of these materials. According to the embodiment illustrated in FIG. 1A, the workpiece surface 210 may be a planar surface. Further, the semiconductor substrate 100 may be attached to a front side carrier 300 such as a glass carrier so that the first workpiece surface 210 is adjacent to the front side carrier 300. Although FIG. 1A explicitly shows a kerf area, it will be readily appreciated that according to a further embodiment the kerf area 155 may be omitted and separation of the single chips may be accomplished using the separation trenches 140.

According to an embodiment, the separation trench 140 may be formed by dry etching, for example plasma etching. According to an embodiment, the separation trench 140 may be formed before forming components of the semiconductor devices. Optionally, the separation trench 140 may be formed by a high temperature process before forming those components of the semiconductor device which are sensitive to high temperature. For example, the separation trench 140 and the isolation trench 130 may be formed by a joint etching step. According to a further embodiment, the separation trench 140 may be formed after thinning the semiconductor substrate 100.

Starting from the pre-processed workpiece shown in FIG. 1A, the back side 220 of the workpiece may be processed, by, optionally, forming a hard mask layer (stack) on the workpiece back side 220, followed by a photoresist layer 240.

Thereafter, openings 241 may be defined in the photoresist layer 240. For example, the openings 241 may be defined so as to be aligned with the position of the filling made of the second sacrificial layer 142 inside the separation trenches 140. When photolithographically defining the openings 241, the isolation trenches 130 may be used as a positioning mark. Thereafter, a further etching step may be performed so as to remove the first sacrificial layer 141. In the embodiment shown in FIG. 1B, since the isolation trench 130 has a function different from that of the separation trench 140, no opening is formed so as to be aligned with the position of the second layer 132 inside the isolation trench 130.

Thereafter, an etching step may be performed so as to define openings 231 in the insulating layer 235. For example, wet etching with hydrofluoric acid (HF) may be performed so as to form the openings. FIG. 1C shows an example of a resulting structure. The openings 231 may approximately have a width corresponding to a width of the separation trenches 140. Nevertheless, the width of the openings 231 should be large enough so that the whole cross-section of the second sacrificial layer 142 is uncovered. Thereafter, the second sacrificial layer 142 is removed from the separation trenches 140. For example, if polysilicon is used as the second sacrificial material, etching with KOH may be employed. According to an embodiment, etching is performed from the back side 220 of the substrate. Hence, removing the at least one sacrificial material from the trench comprises removing the at least one sacrificial material from the bottom side 144 of the trench or from the back side 220 of the substrate. Differently stated, removing the at least one sacrificial material may comprise etching the second sacrificial layer 142 adjacent to the second main surface 120 of the substrate.

Figure 1D:
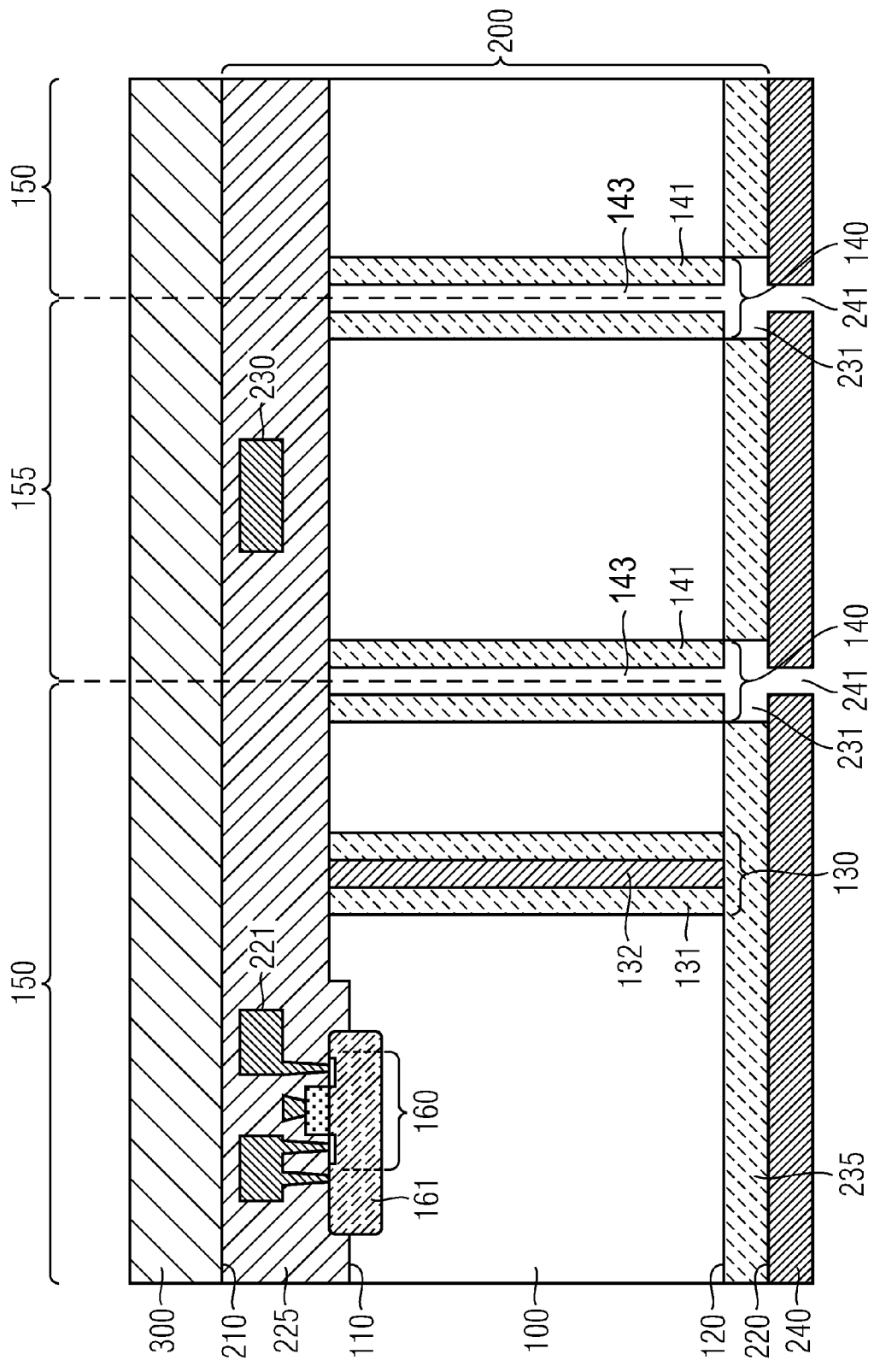

FIG. 1D shows an example of a resulting structure. As is shown, now a gap 143 is formed between the sidewalls of the separation trench 140. The gap 143 extends from the second main surface 120 of the semiconductor substrate 100 to approximately the first main surface 110 of the semiconductor substrate 100. In the context of the present application, the term "extends to approximately the first main surface of the semiconductor substrate" means that a small amount of material may remain within the gap, as long as the small amount does not inhibit or prevent a separation process which will be explained in the following. For example, a remaining amount of material may have a thickness (dimension in the vertical direction) of 0 to 500 nm.

Then, a further etching step, for example, an isotropic wet etching step using, for example, HF, may be performed so as to form openings 226 in the insulating layer 225. FIG. 1E shows an example of a resulting structure. The gap 143 now extends to the workpiece surface 210.

FIG. 1F shows an example of a resulting structure after removing the residues of the photoresist layer 240. Then, the structure is transferred to a foil 400, which may be a foil suitable for separating the wafer into single chips. For example, the foil 400 may be made of a suitable plastic or polymer, as it is conventional.

Figure 1G:
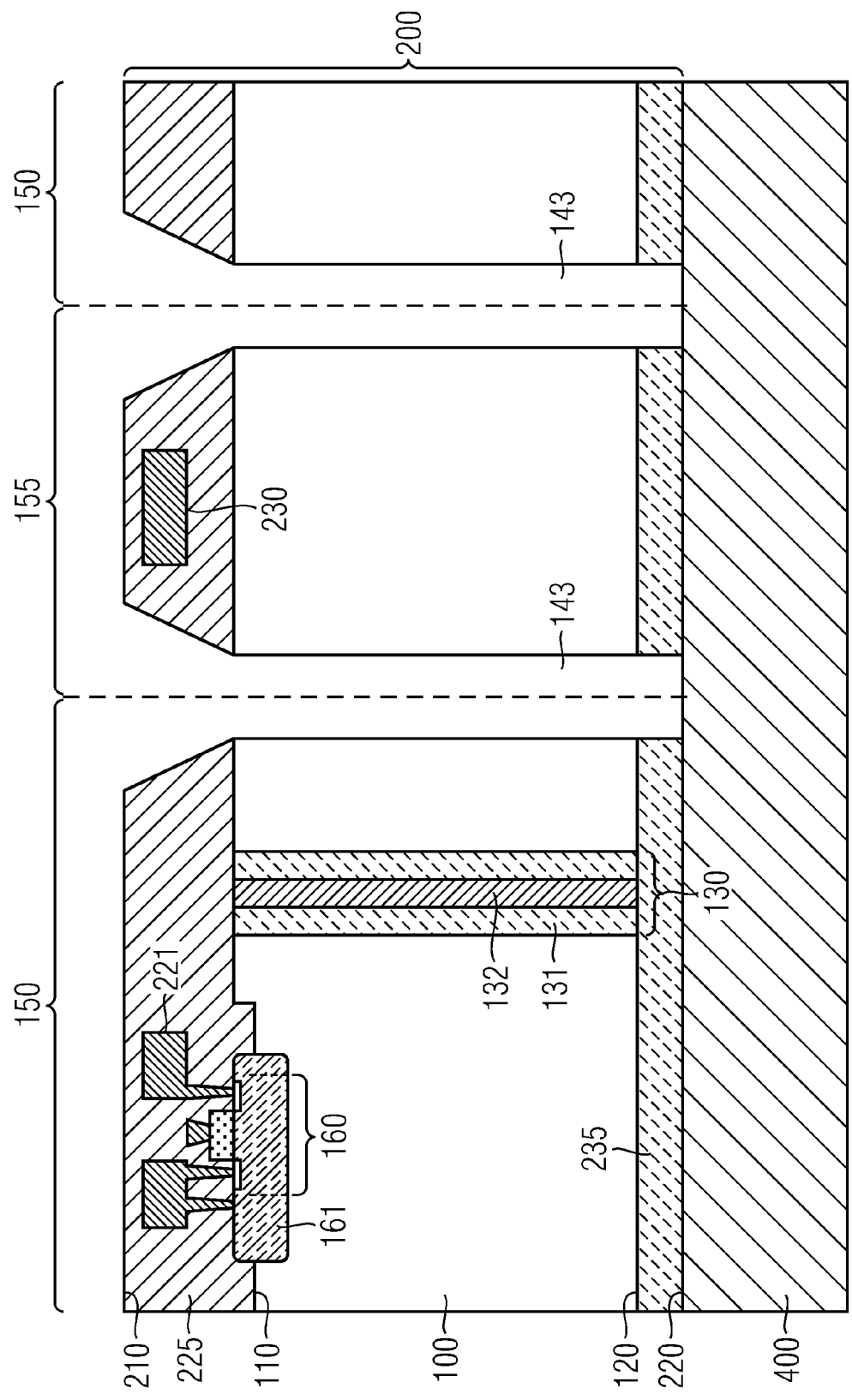

FIG. 1G shows an example of a resulting structure. In the next step, the wafer may be separated into single chips by removing the foil 400 according to generally known methods. By way of example, the foil 400 may be stretched, and UV light may be irradiated from the back side 220 to separate the single chips from the foil 400. Since the separation or isolation of the wafer into chips has been accomplished by the several etching steps, it is not necessary to separate the single chips by dicing or sawing the substrate material 100 as well as the layers formed on the semiconductor substrate 100. As a consequence, the semiconductor material is less likely to be damaged due to the mechanical dicing process. Further, the width of the kerf area 155 may be reduced since there is less material necessary in order to perform the separation process. For example, the width of the kerf area 155 may be approximately 30 to 40 µm.

According to a further embodiment, separation of the single chips may be accomplished by removing the foil 400 according to known processes.

As has been explained above, according to an embodiment, the separation trenches 140 may be defined at a very early processing stage of the semiconductor device, before defining temperature sensitive components. As a result, the separation trenches can be etched using a high temperature etching method. Further, the separation trenches 140 may be defined photolithographically and may be etched by plasma etching, so that, for example, crystal orientations do not need to be taken into account during etching. As a result, it is possible to define the geometry of the single chips photolithographically. Hence, any suitable shape of the single chips may be selected.

FIG. 1H shows an example of examples of shapes of the single chips. For example, as is shown in the left-hand part of FIG. 1h, the chip area 150 may be approximately rectangular, with rounded corners. Separation trenches 140 are disposed between the chip area 150 and the kerf area 155. The kerf area 155 is disposed between adjacent chip areas 150. As shown in the right-hand portion of FIG. 1H, the chip area 150 may also have the shape of hexagon.

Figure 1I:
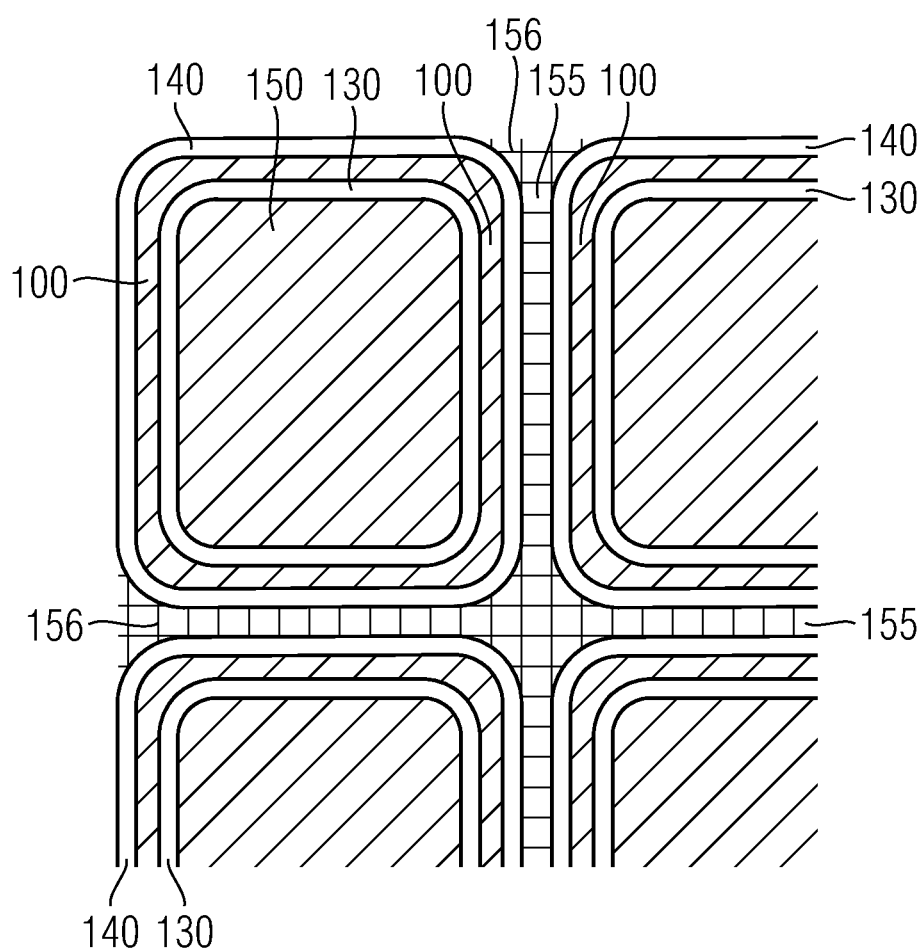

FIG. 1I illustrates a portion of a chip area 150 and a kerf area 155 according to an embodiment. As is shown, the kerf area 155 may be further patterned in a direction parallel to the plane of the cross-section illustrated in FIGS. 1A to 1H by forming additional separation grooves 156 extending in a direction perpendicularly with respect to the separation trenches 140. For example, the separation grooves 156 may be formed by etching the material in the kerf using an appropriate photoresist mask. According to an embodiment, the separation grooves 156 may have a similar structure as the separation trenches 140 that have been described hereinbefore. Due to the presence of the additional separation grooves 156, the kerf area 155 may be patterned and isolated into small pieces so that during the next processing steps, large kerf areas are prevented from being separated from the wafer.

FIG. 1J shows a further embodiment, according to which, starting from the structure shown in FIG. 1G, a further etching step using, for example, KOH is performed so as to define tapered openings 232. Due to the etching with KOH, the tapered openings 232 are etched isotropically.

FIG. 2 illustrates a method according to a further embodiment. A starting point for the further embodiment is a semiconductor substrate 100 comprising a chip area 150 and a kerf area 155 as has been explained above with reference to FIG. 1A.

Figure 2A:
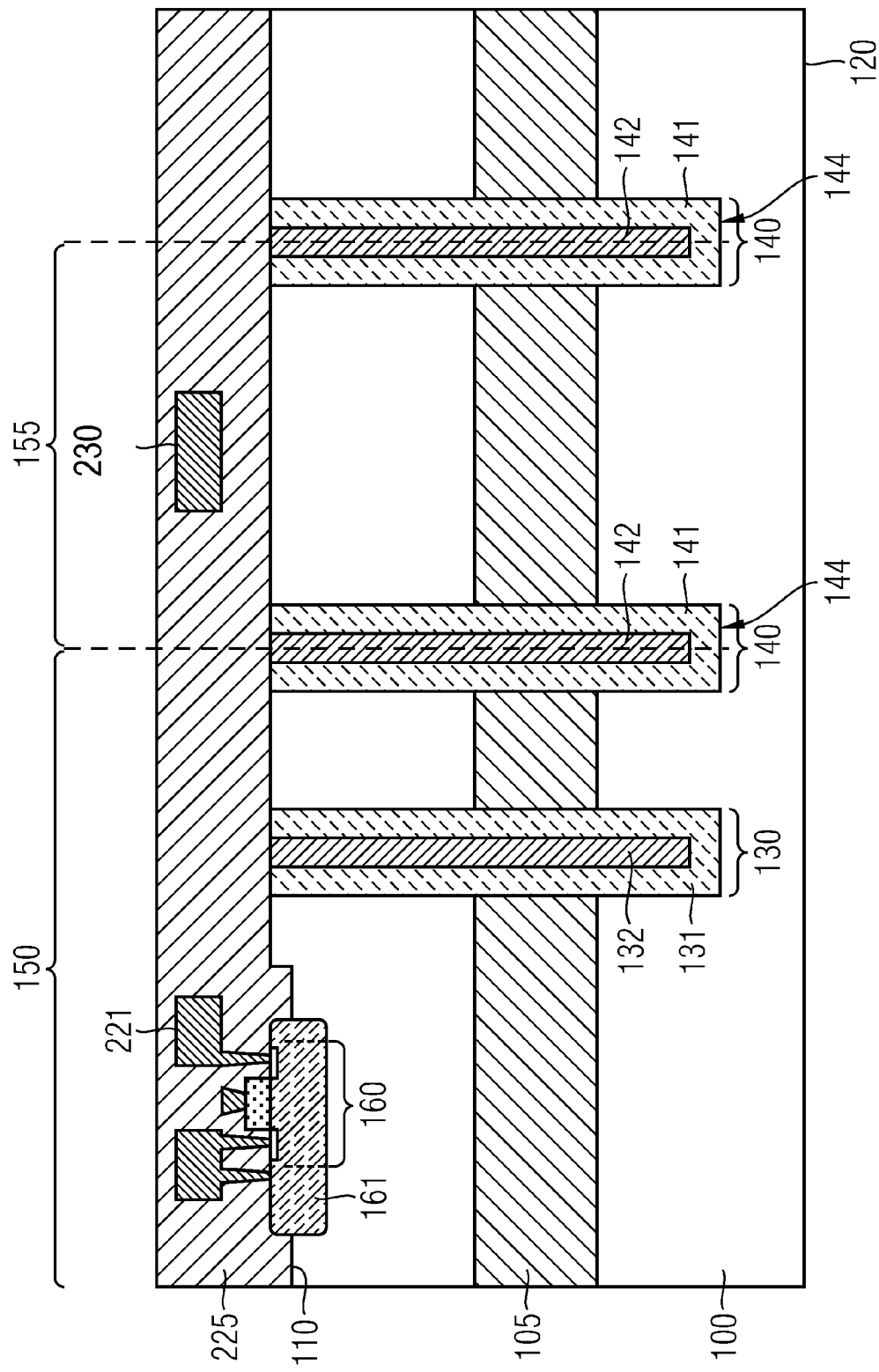

According to the embodiment shown in FIG. 2A, separation trenches 140 are etched in the first main surface 110 of the semiconductor substrate 100. Further, isolation trenches 130 may be defined in the first main surface 110 of the semiconductor substrate 100. An insulating material 131, 141 may be disposed adjacent to the sidewalls of the isolation trench 130 and the separation trench 140. Further, a second sacrificial layer 142 such as polysilicon may be disposed in the interior of the separation trenches 140. Differing from the embodiment shown in FIG. 1A, the semiconductor substrate 100 of FIG. 2A has not been thinned. Accordingly, the distance between the second main surface 120 and the first main surface 110 corresponds to the usual thickness of a semiconductor wafer. The isolation trenches 130 and the separation trenches 140 do not extend to the second main surface 120.

The insulating material 131, 141 is disposed in the isolation trench 130 and the separation trench 140, respectively, to extend to a bottom side 144 of these trenches. An insulating layer 225 is disposed over the semiconductor device components disposed in the chip area 150. The insulating layer 225 may also be disposed over contacts and conductive lines 230, 221 disposed in the kerf area 155. According to the embodiment shown in FIG. 2A, no frontside carrier is attached to the workpiece surface 210. Hence, test procedures and measurements may be performed in the kerf area 155. The insulating layer 225 has a planar surface. Thereafter, a photoresist layer 240 is formed over the insulating layer 225 and is patterned to form an etching mask. Then, the oxide layer is etched to form openings 227.

FIG. 2B shows an example of a resulting structure. In a next step, an insulating material such as a polyimide layer 228 is formed over the resulting structure after removing the residues of the photoresist layer 240. Further, the polyimide layer 228 is photolithographically patterned. Due to the presence of the polyimide layer 228 which is disposed over the patterned oxide layer, the wafer has increased mechanical robustness.

Figure 2C:
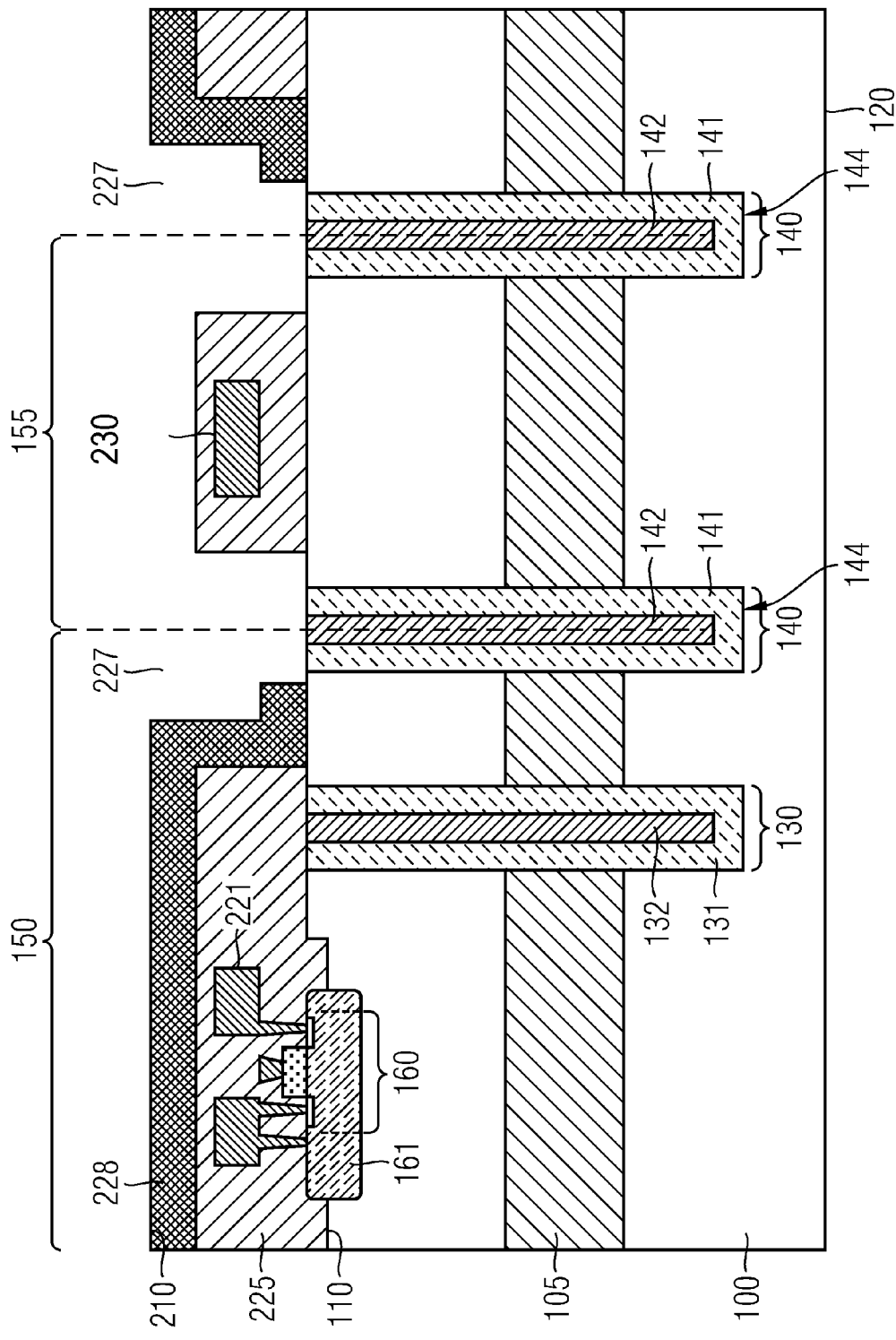

FIG. 2C shows an example of a resulting structure. As is shown, in the chip area 150, the insulating layer 225 is covered by the polyimide layer 228, whereas the insulating layer 225 disposed in the kerf area 155 is uncovered. Further, at the position of the openings 227, the semiconductor substrate material 100 and the separation trenches 140 are uncovered. A surface of the polyimide layer 228 forms a workpiece surface 210. As is shown, the workpiece surface is not flat but has a topology. In the next step, a suitable carrier 300 such as a glass carrier is attached to the main surface 210 of the workpiece 200.

Thereafter, the semiconductor substrate 100 is thinned from the second main surface 120. For example, the semiconductor substrate 100 may be thinned by mechanically grinding, followed by CMP so as to cure defects which may be caused due to the grinding. For example, about 750 μm thickness of the semiconductor wafer may be removed.

Figure 2D:
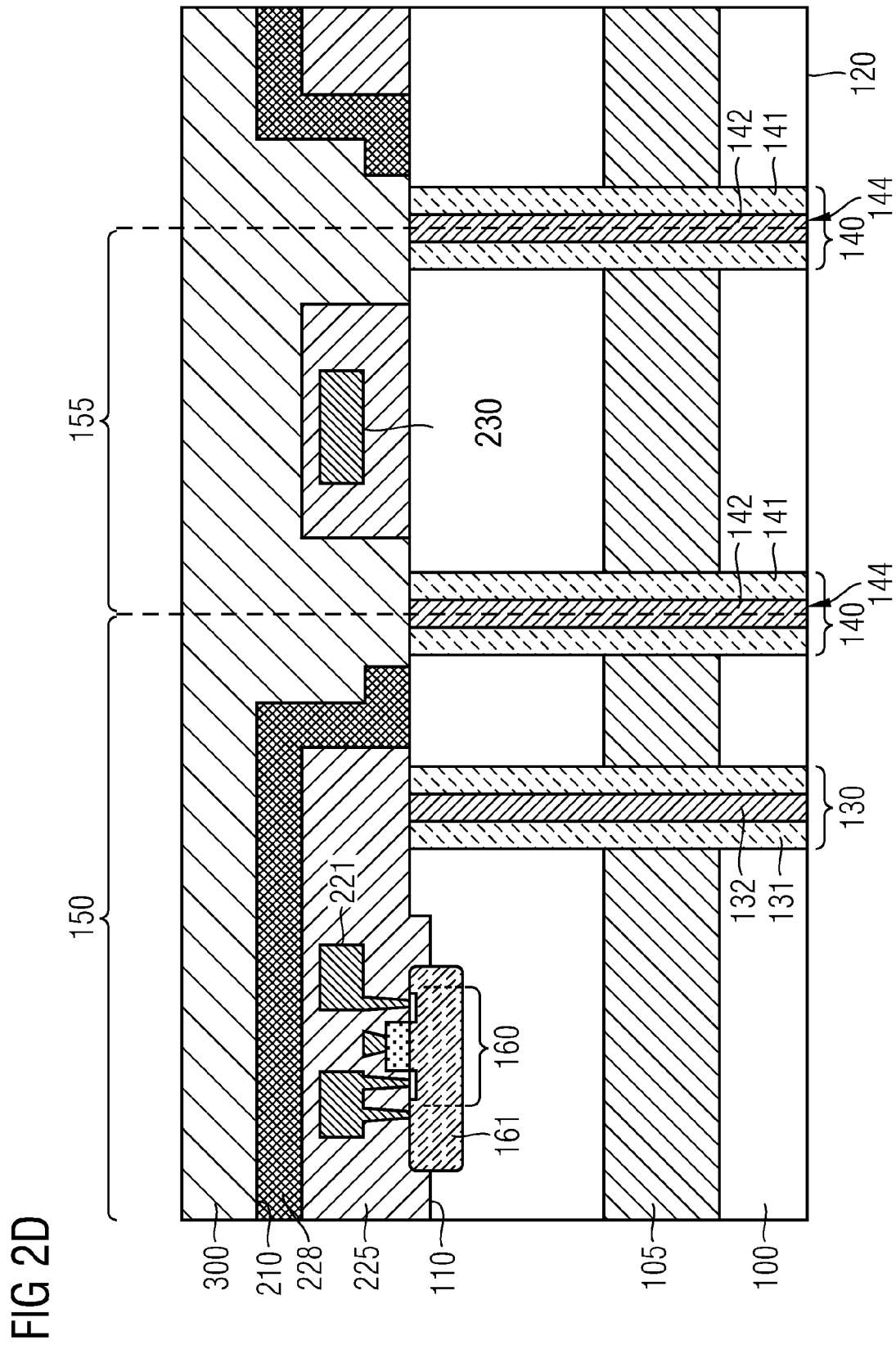

FIG. 2D shows an example of a resulting structure. The shown semiconductor substrate 100 has a thickness of less than 100 μm. For example, the thickness may be about 10 to 100 μm. At a thickness larger than 100 μm, it becomes difficult to define an isolation trench 130 and the separation trench 140 having the desired geometry. Thereafter, a photoresist layer 240 may be formed on the second surface 120 of the semiconductor substrate 100 and may be patterned so as to form openings 241.

FIG. 2E shows an example of a resulting structure. Then, optionally, an isotropic etching step, for example using KOH, may be performed so as to form openings 232 in the substrate material 100.

FIG. 2F shows an example of a resulting structure. Thereafter, an etching step is performed so as to remove the insulating layer (first sacrificial layer) 141 from the separation trenches 140. According to the embodiment of FIG. 2F, the first sacrificial layer 141 is removed from the bottom side 144 of the trench. Differently stated, etching is performed from the back side 120 of the semiconductor substrate 100. Further, the residues of the photoresist layer 240 are removed.

Figure 2G:
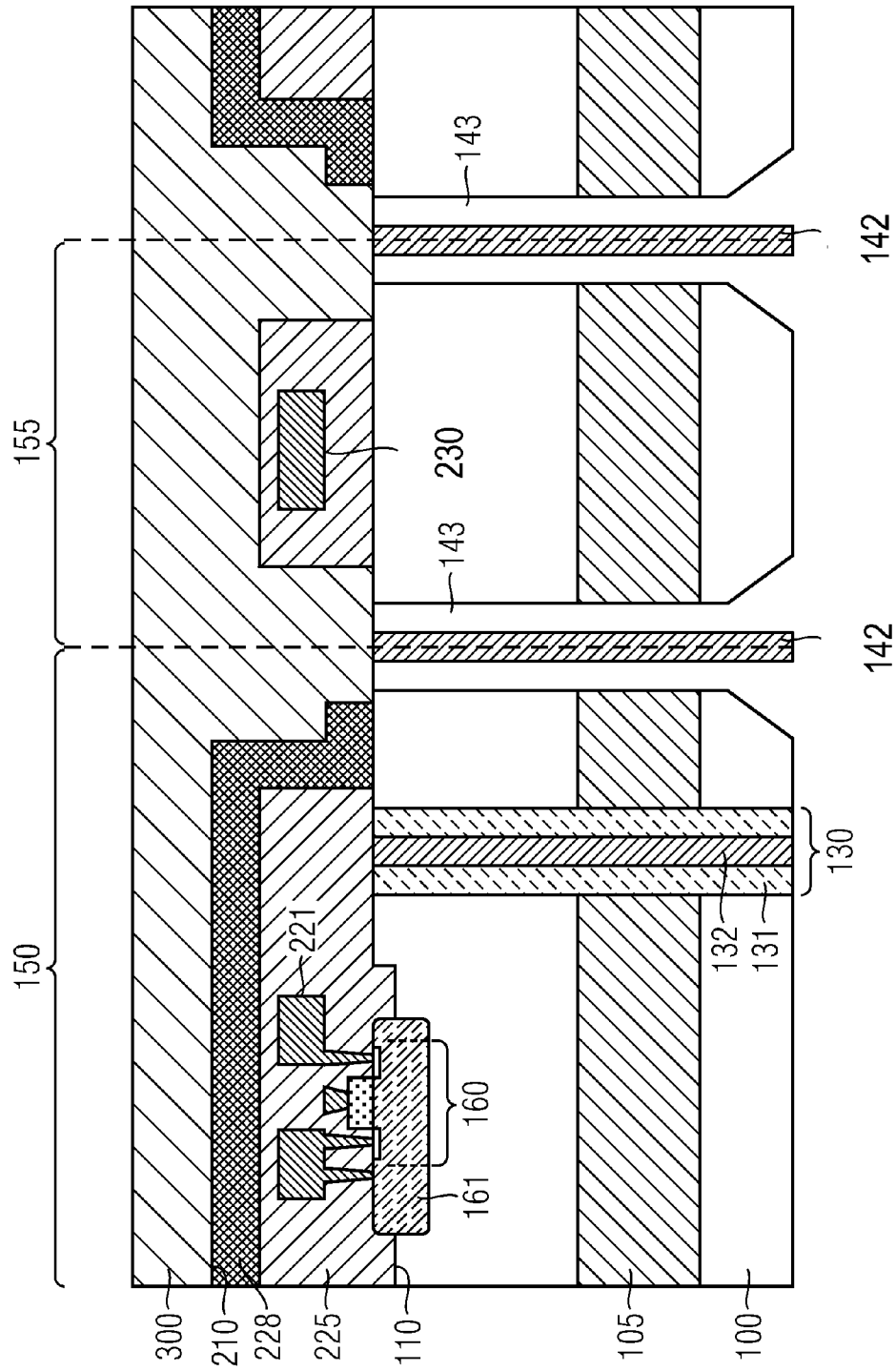

FIG. 2G shows an example of a resulting structure. As is shown, a gap 143 is formed between the sidewalls of the separation trench 140. The gap 143 extends from the second main surface 120 to approximately the first main surface 110 of the semiconductor substrate 100. Residues of the sacrificial filling 142 are disposed within the gap 143. Thereafter, the semiconductor substrate 100 is transferred to a foil so that the second main surface 120 of the semiconductor substrate 100 is adjacent to the foil 400. The glass carrier 300 is removed from the surface of the workpiece 210 by conventional methods.

FIG. 2H shows an example of a resulting structure. Due to the transfer process, the residues of the sacrificial material 142 may drop. Thereafter, the semiconductor substrate 100 may be separated into single chips by removing the foil 400.

Figure 3A:
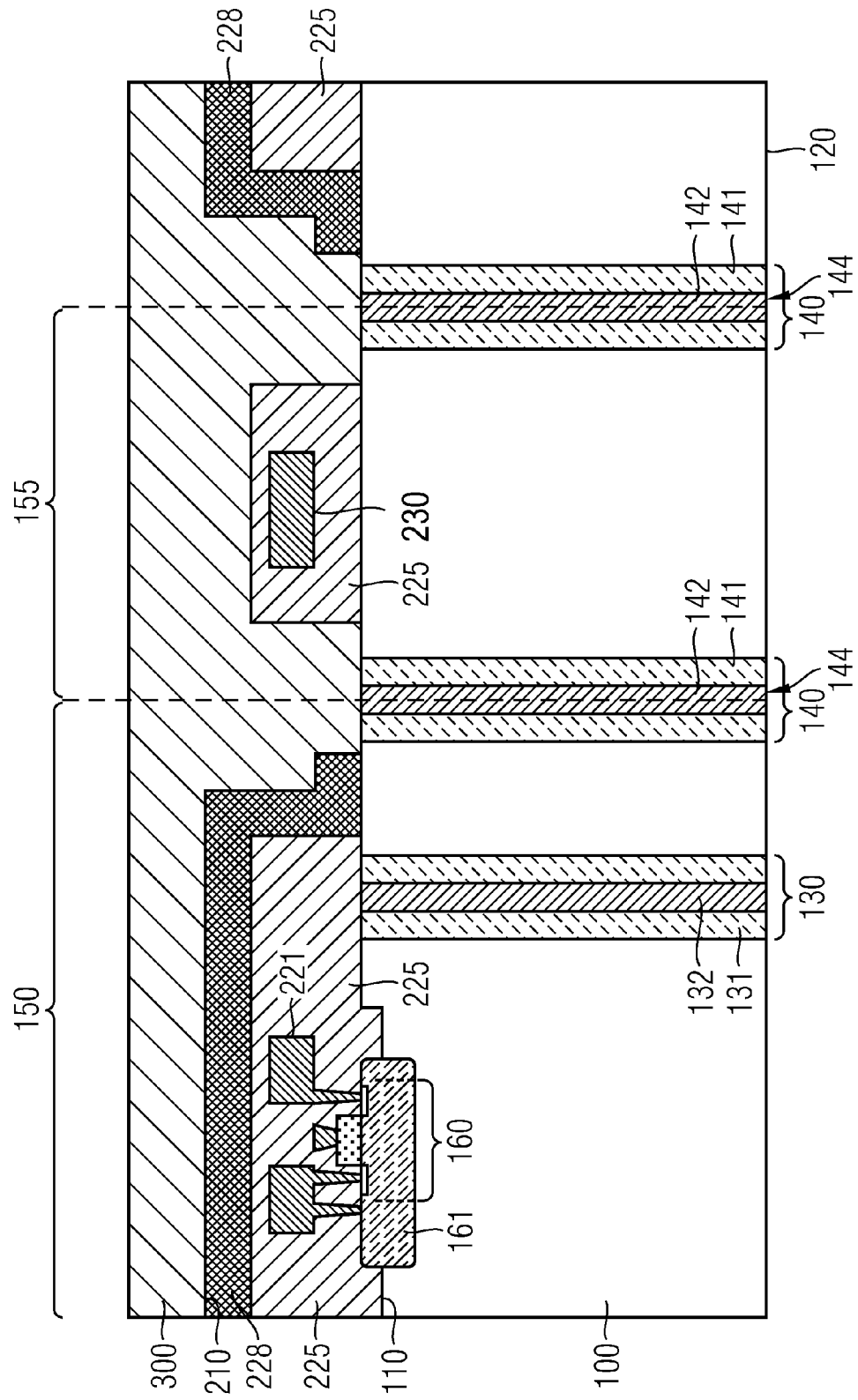

A starting point of a further embodiment is the structure illustrated in FIG. 3A which corresponds to the structure shown in FIG. 2D. The components shown in FIG. 3A correspond to those which have been illustrated with reference to FIGS. 1 and 2. According to the embodiment illustrated in FIG. 3, the sidewall insulating material 141, which may be for example, a silicon oxide layer, remains at the sidewalls of the separation trenches 140 during the processing method so as to establish a sidewall oxide of the resulting chips. An insulating layer 235 such as a silicon oxide layer is formed on the second main surface 120 of the semiconductor substrate 100. Optionally, metal pads may be formed adjacent to the second main surface 120 before forming the insulating layer 235 so as, for example, to be in contact with the conductive filling 132 of the isolation trench 130. Thereafter, a photoresist material 240 is formed over the insulating layer 235. Further, openings 241 are defined in the photoresist material 240.

Figure 3B:
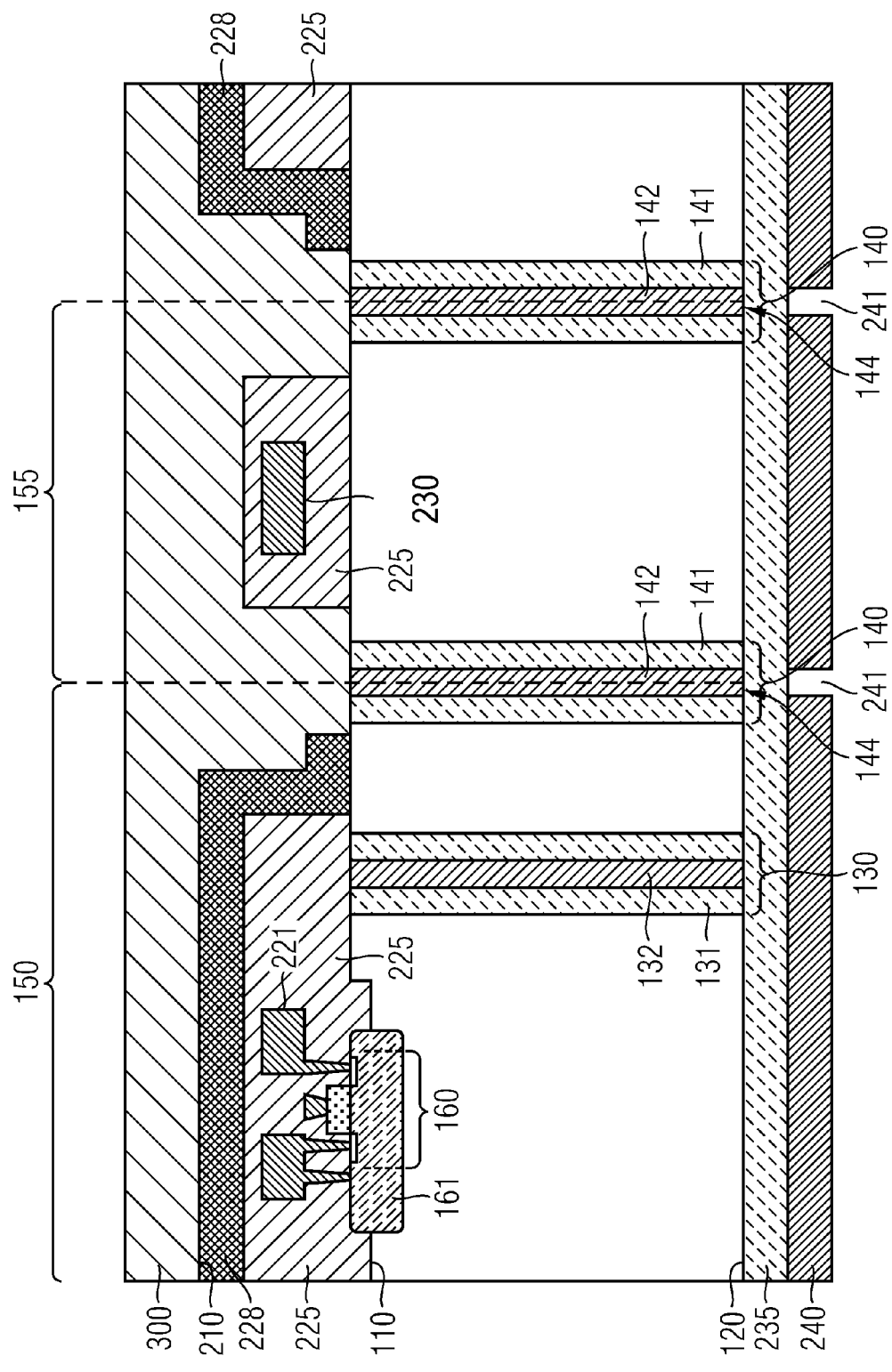

FIG. 3B shows an example of a resulting structure. Using the patterned photoresist layer 240 as an etching mask, openings 231 are formed in the insulating layer 235. The openings 241 in the photoresist layer 240 and, thus, the openings 231 in the insulating layer 235 are positions over the sacrificial material 142 in the separation trenches 140.

Figure 3C:
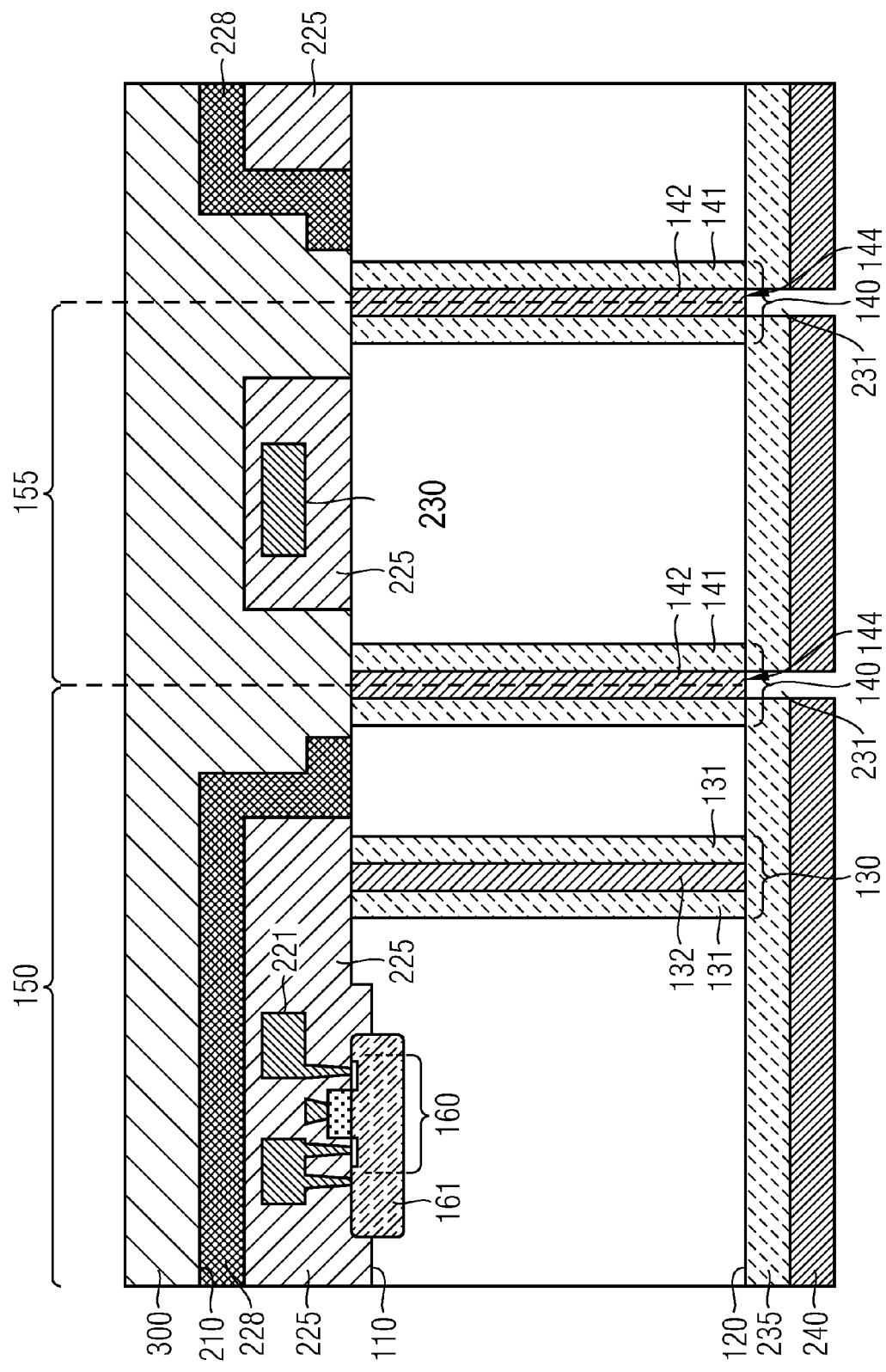
Figure 3E:
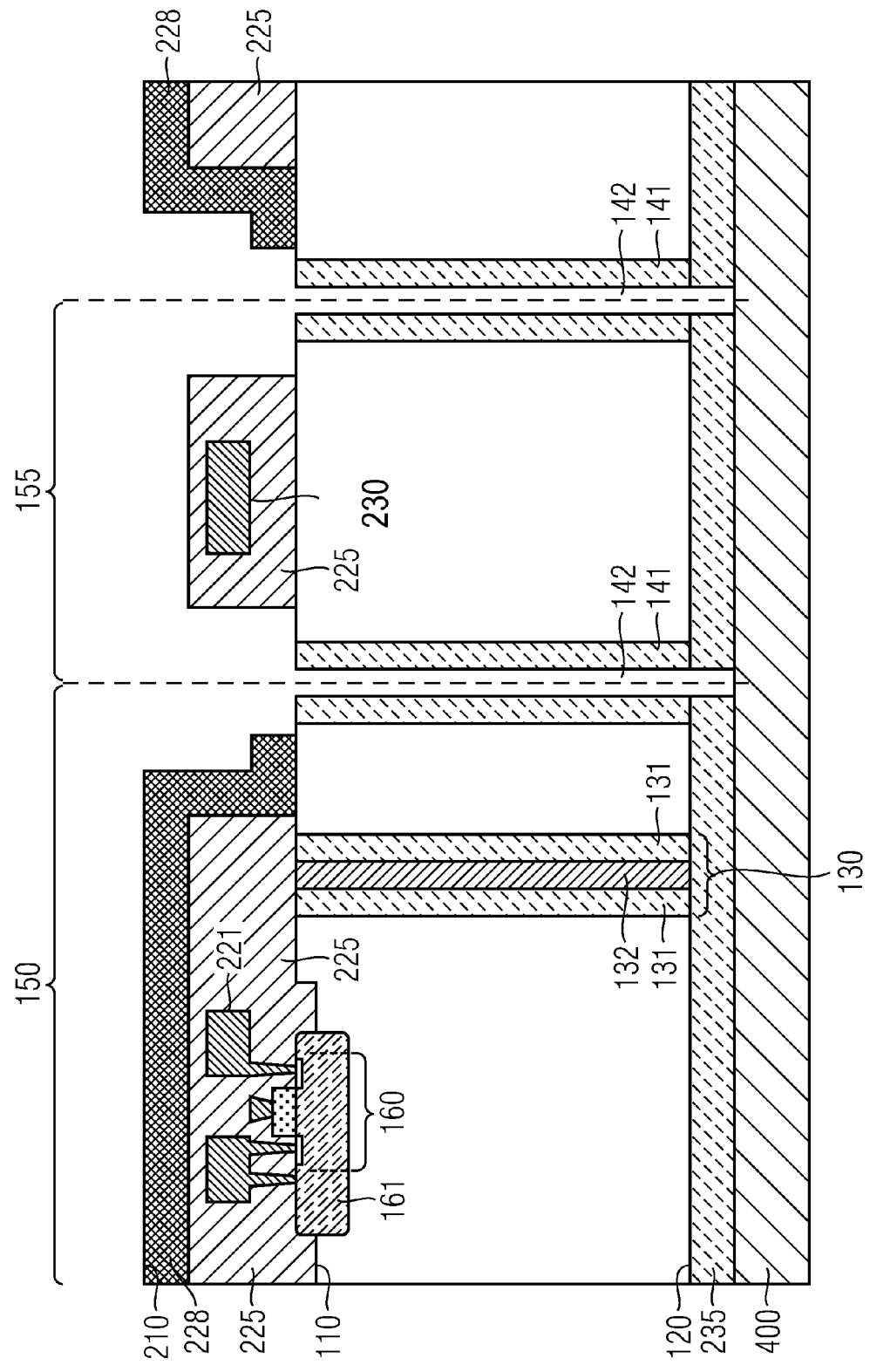

FIG. 3C shows an example of a resulting structure. Thereafter, the residues of the photoresist layer 240 are removed, followed by a wet etching step so as to remove the sacrificial material 142 from the separation trenches 140. According to the embodiment of FIG. 3C, etching is performed from the back side of the semiconductor substrate 100.

FIG. 3D shows an example of a resulting structure. As is shown, the sidewalls of the substrate material 100 and the second main surface 120 are covered by the insulating layer 132 in the chip areas 150 and in the kerf area 155. Further, a gap 143 is disposed between the sidewalls of the separation trench 140. The gap 143 extends from the second main surface 120 to approximately the first main surface 110. Thereafter, the resulting structure is transferred to the foil 400. Further, the glass carrier is removed from the surface 210 of the workpiece 200 according to a conventional method. According to embodiments, the kerf area 155 may be patterned in more detail, e.g. in a plane disposed before or behind the depicted plane of the drawing. According to this embodiment, it is possible that the patterned pieces of the kerf area 155 drops when the transfer to the foil 400 takes place.

Thereafter, the foil 400 may be removed so as to separate the processed semiconductor substrate 100 into single chips.

Figure 4B:
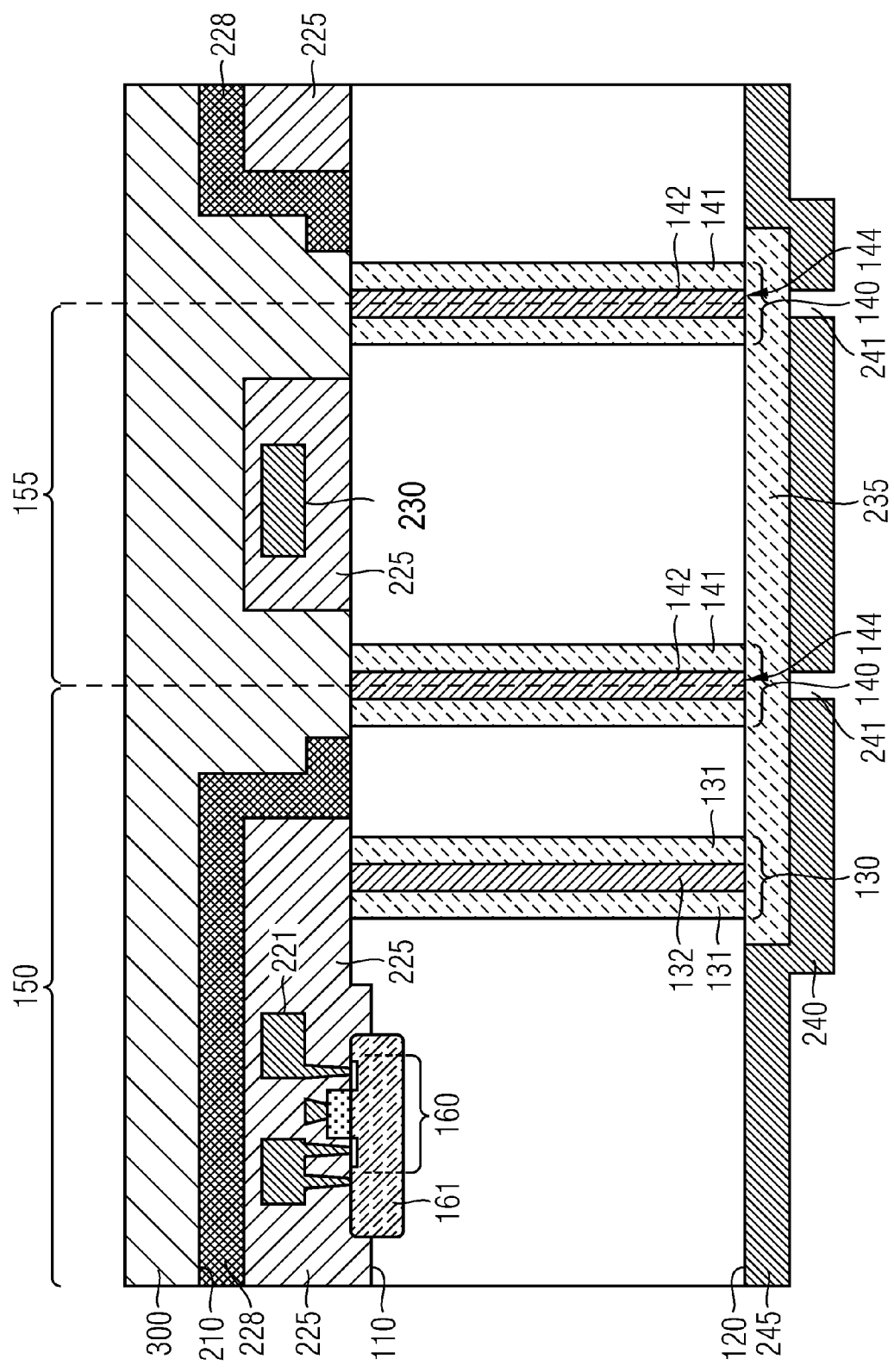
Figure 4D:
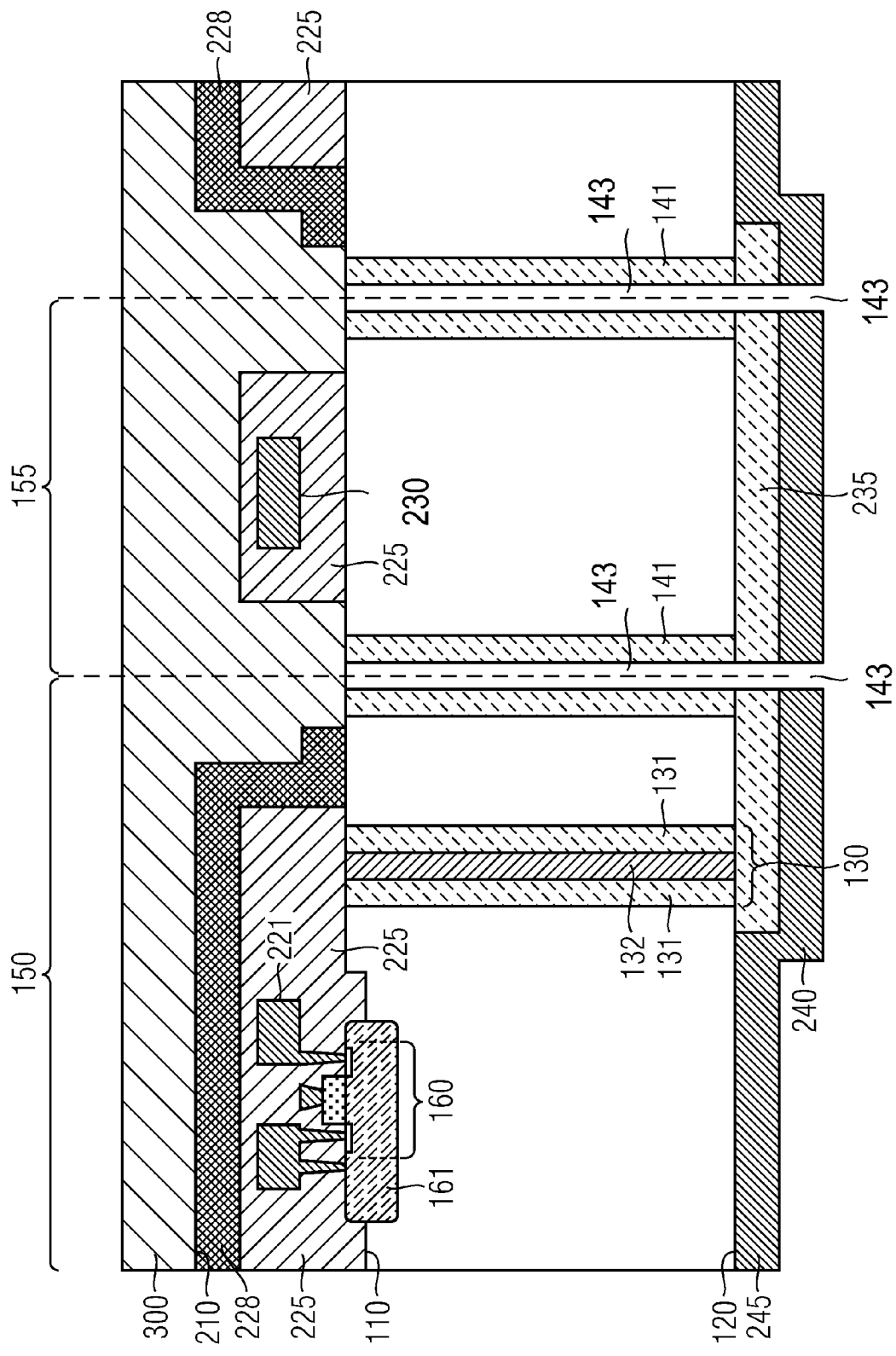
Figure 4E:
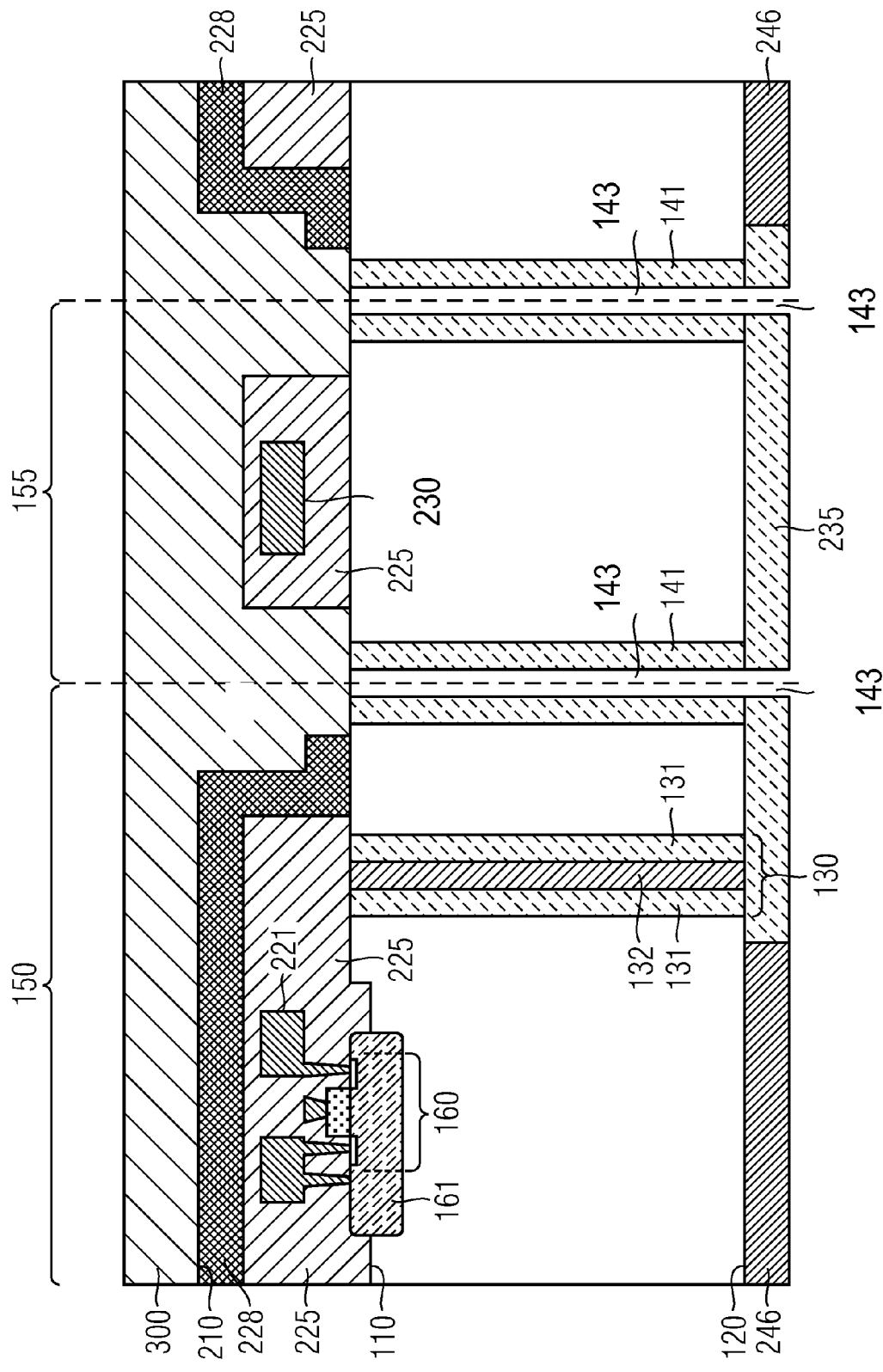

Starting point for the embodiment which is illustrated in FIG. 4 is the structure shown in FIG. 3A. According to this embodiment, an insulating layer disposed on the back side of the substrate is patterned. After removing at least one sacrificial material from the trench, a conductive layer is formed and patterned on the back side.

Starting from the structure shown in FIG. 3A, an insulating layer 235 is formed on the second main surface 120 of the semiconductor substrate 100. Thereafter, a photoresist layer 240 is formed on the insulating layer 235 and patterned. FIG. 4A shows an example of a resulting structure. Then, using the patterned photoresist layer 240 as an etching mask, etching is performed so as to partially remove the insulating layer 235 and a further photoresist layer 245 is formed over the resulting surface. In a next step, openings 241 are defined in the photoresist layer 240.

FIG. 4B shows an example of a resulting structure. As is shown, the insulating layer 235 is formed over a portion of the second main surface 120 of the semiconductor substrate 100. Thereafter, openings 231 are formed in the insulating layer 235, using the patterned photoresist layer 240 as an etching mask.

FIG. 4C shows an example of a resulting structure. Then, the sacrificial material 142 is removed from the separation trenches 140 by etching. According to the embodiment shown in FIG. 4C, etching is performed from the back side of the semiconductor substrate 100. FIG. 4D shows an example of a resulting structure. As is shown, a gap 143 is disposed between the sidewalls of the separation trench 140. The gap 143 extends from the second main surface 120 to approximately the first main surface 110 of the semiconductor substrate 100. The residues of the photoresist material 240, 245 are removed, and a metal layer 246 may be formed adjacent to the second main surface 120 of the semiconductor substrate 100. It is to be noted that the shown transistor 160 may be connected to the metal layer 246 by means of a connection which is disposed before or behind the shown drawing plane. Thereafter, the semiconductor substrate 100 is transferred to a foil 400 and the glass carrier 300 may be removed. FIG. 4F shows an example of a resulting structure. Thereafter, the semiconductor wafer may be separated into single chips by removing the foil 400.

FIG. 5 illustrates a method of manufacturing a semiconductor device according to an embodiment in a flowchart. As is shown, a method of manufacturing a semiconductor device comprises forming a separation trench into a first main surface of a semiconductor substrate (S10), forming at least one sacrificial material in the separation trench (S20), removing substrate material from a second main surface of the semiconductor substrate (S30), the second main surface being opposite to the first main surface, so as to uncover a bottom side of the trench, and removing at least one sacrificial material from the trench (S40), comprising etching the at least one sacrificial material adjacent to the second main surface.

According to a different interpretation, a method of manufacturing a semiconductor device comprises forming a separation trench into a first main surface of a semiconductor substrate (S10), forming at least one sacrificial material in the separation trench (S20), removing substrate material from a second main surface of the semiconductor substrate (S30), the second main surface being opposite to the first main surface, so as to uncover a bottom side of the trench, and removing at least one sacrificial material from the trench (S40) so as to form a gap between sidewalls of the separation trench, the gap extending from the second main surface to approximately the first main surface.

FIGS. 6A and 6B illustrate a method of manufacturing a semiconductor device according to a further embodiment. According to the embodiment, the semiconductor device is formed in a semiconductor substrate comprising a first main surface, and the semiconductor substrate includes chip areas. As is shown in FIG. 6A, the method comprises forming components of the semiconductor device in the first main surface in the chip areas (S110), removing substrate material from a second main surface of the semiconductor substrate (S120), the second main surface being opposite to the first main surface, forming a separation trench into a first main surface of a semiconductor substrate (S130) between adjacent chip areas, forming at least one sacrificial material in the separation trench (S140), and, thereafter, removing at least one sacrificial material from the trench (S150). According to the embodiment shown in FIG. 6A, the substrate material is removed from the second main surface (S120) before forming the separation trench (S130), and the separation trench is formed to extend to the second main surface.

According to the embodiment shown in FIG. 6B, the separation trench is formed (S130) and the at least one sacrificial material is formed (S140) before removing the substrate material (S120), and the substrate material is removed so as to uncover a bottom side of the trench.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:
   forming a separation trench into a first main surface of a semiconductor substrate;
   forming at least one sacrificial material in the separation trench;
   forming an isolation trench in the semiconductor substrate, filling at least one insulating material in the isolation trench, wherein forming the separation trench and forming the isolation trench comprise joint processing methods;
   removing substrate material from a second main surface of the semiconductor substrate, the second main surface being opposite to the first main surface, so as to uncover a bottom side of the trench; and
   removing the at least one sacrificial material from the bottom side of the trench, after the substrate material has been removed from the second main surface.

2. The method according to claim 1, wherein the separation trench is completely filled with the at least one sacrificial material.

3. The method according to claim 1, wherein the sacrificial material comprises a first sacrificial layer adjacent to a sidewall of the separation trench, and a second sacrificial layer, being different from the first sacrificial layer, the first sacrificial layer being made of an insulating material.

4. The method according to claim 3, wherein removing at least one sacrificial material comprises removing the second sacrificial layer.

5. The method according to claim 3, wherein removing at least one sacrificial material comprises removing the first sacrificial layer.

6. The method according to claim 1, further comprising forming at least one transistor adjacent to the first main surface, wherein forming the separation trench is accomplished before forming the transistor.

7. The method according to claim 1, further comprising forming at least one additional layer on the first main surface so as to define a workpiece surface, attaching the semiconductor substrate to a front side carrier, so that the workpiece surface is adjacent to the front side carrier, before removing the at least one sacrificial material from the separation trench.

8. The method according to claim 7, further comprising:
   forming at least one layer on the second main surface of the semiconductor substrate so as to define a workpiece back side; and attaching the semiconductor substrate to a back side carrier, so that the workpiece back side is attached to the back side carrier, after removing the at least one sacrificial material from the separation trench.

9. The method according to claim 8, wherein attaching the semiconductor substrate to the back side carrier is accomplished after removing at least one sacrificial material from the separation trench.

10. The method according to claim 7, wherein the workpiece surface has a planar surface when the front side carrier is attached to the semiconductor substrate.

11. The method according to claim 7, wherein the workpiece surface is a non-planar surface when the front side carrier is attached to the semiconductor substrate.

12. The method according to claim 4, further comprising forming and patterning a further insulating layer on the second main surface before removing the second sacrificial layer, wherein the further insulating layer is patterned in such a manner that the second main surface is completely covered by the further insulating layer in portions between adjacent separation trenches.

13. The method of claim 1, further comprising forming a contact trench extending from the first main surface to the second main surface, the contact trench being filled with at least one conductive material, wherein forming the contact trench and forming the separation trench comprise joint processing methods.

14. The method of claim 1, further comprising:
forming and patterning a further insulating layer on the second main surface after removing the substrate material from the second main surface of the semiconductor substrate; and
forming a conductive material on the second main surface after removing the at least one sacrificial material from the trench.

15. The method of claim 1, wherein removing the at least one sacrificial material is performed so as to form a gap between sidewalls of the separation trench, the gap extending from the second main surface to approximately the first main surface.

16. A method of manufacturing a semiconductor device in a semiconductor substrate comprising a first main surface, the semiconductor substrate including chip areas, the method comprising:
forming components of the semiconductor device in the first main surface in the chip areas;
removing substrate material from a second main surface of the semiconductor substrate, the second main surface being opposite to the first main surface;
thereafter, forming a separation trench into the first main surface of the semiconductor substrate, the separation trench being disposed between adjacent chip areas, the separation trench extending to the second main surface;
forming at least one sacrificial material in the separation trench; and
removing the at least one sacrificial material from the trench.

17. A method of manufacturing a semiconductor device, comprising:

forming a separation trench into a first main surface of a semiconductor substrate;
forming at least one sacrificial material in the separation trench;
removing substrate material from a second main surface of the semiconductor substrate so as to thin the substrate to a thickness of less than 100 µm, the second main surface being opposite to the first main surface, so as to uncover a bottom side of the trench; and
removing the at least one sacrificial material from the bottom side of the trench, after the substrate material has been removed from the second main surface.

18. The method according to claim 17, wherein the separation trench is completely filled with the at least one sacrificial material.

19. The method according to claim 17, further comprising forming an isolation trench in the semiconductor substrate, filling at least one insulating material in the isolation trench, wherein forming the separation trench and forming the isolation trench comprise joint processing methods.

20. The method according to claim 17, wherein the sacrificial material comprises a first sacrificial layer adjacent to a sidewall of the separation trench, and a second sacrificial layer, being different from the first sacrificial layer, the first sacrificial layer being made of an insulating material.

21. The method according to claim 20, wherein removing at least one sacrificial material comprises removing the second sacrificial layer.

22. The method according to claim 17, further comprising forming a contact trench extending from the first main surface to the second main surface, the contact trench being filled with at least one conductive material, wherein forming the contact trench and forming the separation trench comprise joint processing methods.

23. The method of claim 17, further comprising:
forming and patterning a further insulating layer on the second main surface after removing the substrate material from the second main surface of the semiconductor substrate; and
forming a conductive material on the second main surface after removing the at least one sacrificial material from the trench.

24. A method of manufacturing a semiconductor device, comprising:
forming a separation trench into a first main surface of a semiconductor substrate;
forming at least one sacrificial material in the separation trench, the sacrificial material comprising a first sacrificial layer adjacent to a sidewall of the separation trench, and a second sacrificial layer, being different from the first sacrificial layer, the first sacrificial layer being made of an insulating material;
removing substrate material from a second main surface of the semiconductor substrate, the second main surface being opposite to the first main surface, so as to uncover a bottom side of the trench; and
removing the at least one sacrificial material from the bottom side of the trench, after the substrate material has been removed from the second main surface.

* * * * *